United States Patent
Hunter et al.

[11] Patent Number: 6,067,648
[45] Date of Patent: May 23, 2000

[54] PROGRAMMABLE PULSE GENERATOR

[75] Inventors: Paul R. Hunter; Archer R. Lawrence; Jack C. Little, all of Austin, Tex.

[73] Assignee: Tanisys Technology, Inc., Austin, Tex.

[21] Appl. No.: 09/032,968

[22] Filed: Mar. 2, 1998

[51] Int. Cl.[7] .............................. G11C 29/00; H03K 5/04; H03K 7/08
[52] U.S. Cl. ..................... 714/718; 327/170; 327/172; 327/175; 327/176; 327/291
[58] Field of Search ..................... 714/718, 724; 327/24, 27, 31, 35, 36, 37, 152, 153, 170, 172, 176, 175, 269, 291, 299

[56] References Cited

U.S. PATENT DOCUMENTS

| | | | |
|---|---|---|---|
| 3,162,815 | 12/1964 | Mogensen ............................. | 327/115 |
| 3,840,815 | 10/1974 | Masters ................................ | 327/176 |
| 3,976,940 | 8/1976 | Chau et al. ........................... | 714/736 |
| 4,165,490 | 8/1979 | Howe, Jr. et al. .................... | 327/172 |
| 4,415,861 | 11/1983 | Palmquist et al. ................... | 327/176 |
| 4,464,581 | 8/1984 | Oritani ................................ | 327/172 |
| 4,490,821 | 12/1984 | Lacher ................................ | 714/700 |
| 4,494,021 | 1/1985 | Bell et al. ............................ | 327/262 |
| 4,550,307 | 10/1985 | Akashi et al. ....................... | 341/144 |
| 4,637,018 | 1/1987 | Flora et al. ......................... | 714/100 |
| 4,755,704 | 7/1988 | Flora et al. ......................... | 327/152 |
| 4,797,585 | 1/1989 | Segawa et al. ...................... | 327/172 |
| 4,868,522 | 9/1989 | Popat et al. ......................... | 331/2 |
| 5,008,563 | 4/1991 | Kenney et al. ...................... | 327/176 |
| 5,028,824 | 7/1991 | Young ................................. | 327/262 |
| 5,122,679 | 6/1992 | Ishii et al. ........................... | 327/147 |
| 5,144,255 | 9/1992 | Malka et al. ........................ | 327/106 |
| 5,208,598 | 5/1993 | Lueker et al. ....................... | 341/182 |
| 5,224,129 | 6/1993 | Lueker et al. ....................... | 375/371 |
| 5,293,626 | 3/1994 | Priest et al. ......................... | 713/401 |
| 5,298,866 | 3/1994 | Kaplinsky ........................... | 327/261 |
| 5,306,959 | 4/1994 | Knauft et al. ....................... | 327/292 |
| 5,307,381 | 4/1994 | Ahuja et al. ........................ | 375/356 |
| 5,309,034 | 5/1994 | Ishibashi et al. .................... | 327/174 |
| 5,313,108 | 5/1994 | Lee et al. ............................ | 327/161 |
| 5,418,932 | 5/1995 | Watabe et al. ...................... | 713/500 |
| 5,422,585 | 6/1995 | Fan Chiangi et al. .............. | 327/170 |
| 5,446,867 | 8/1995 | Young et al. ....................... | 713/503 |
| 5,481,573 | 1/1996 | Jacobowitz et al. ................ | 375/356 |
| 5,485,490 | 1/1996 | Leung et al. ....................... | 375/371 |
| 5,486,783 | 1/1996 | Baumert et al. .................... | 327/147 |
| 5,554,946 | 9/1996 | Curran et al. ....................... | 327/172 |
| 5,559,477 | 9/1996 | Tozun et al. ........................ | 331/57 |
| 5,568,075 | 10/1996 | Curran et al. ....................... | 327/172 |
| 5,570,045 | 10/1996 | Erdal et al. ......................... | 326/93 |
| 5,570,053 | 10/1996 | Takla .................................. | 327/292 |
| 5,594,376 | 1/1997 | McBride et al. .................... | 327/236 |
| 5,610,546 | 3/1997 | Carbou et al. ...................... | 327/261 |
| 5,631,596 | 5/1997 | Sporck et al. ...................... | 327/378 |
| 5,638,016 | 6/1997 | Eitrheim ............................. | 327/175 |
| 5,640,547 | 6/1997 | Hotta et al. ......................... | 713/500 |
| 5,642,067 | 6/1997 | Grace .................................. | 327/134 |
| 5,686,846 | 11/1997 | Holcomb et al. ................... | 327/37 |
| 5,781,049 | 7/1998 | Fugo ................................... | 327/166 |

*Primary Examiner*—Emmanuel L. Moise
*Attorney, Agent, or Firm*—Baker & Botts L.L.P.

[57] ABSTRACT

A digital programmable delay which provides a series of pulses that are programmed in both pulse latency and trigger latency to control the operation of a memory module test system.

8 Claims, 15 Drawing Sheets

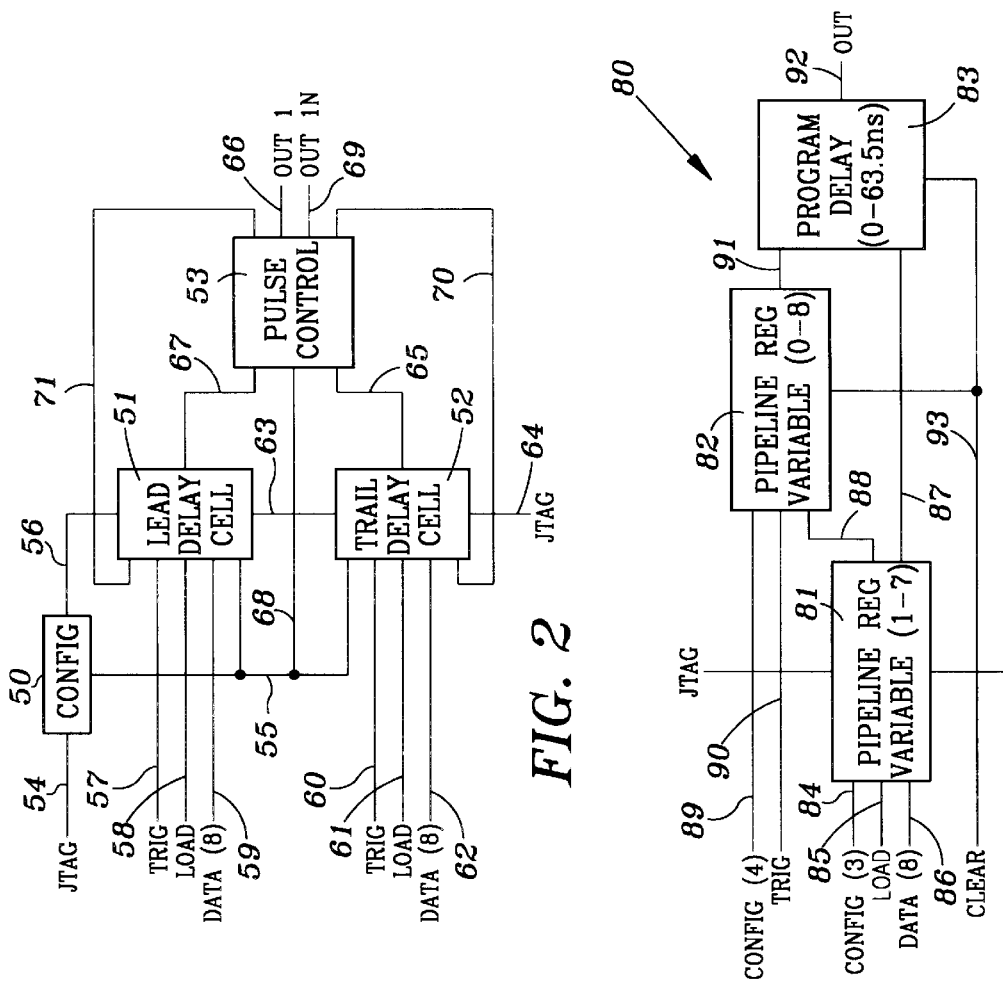
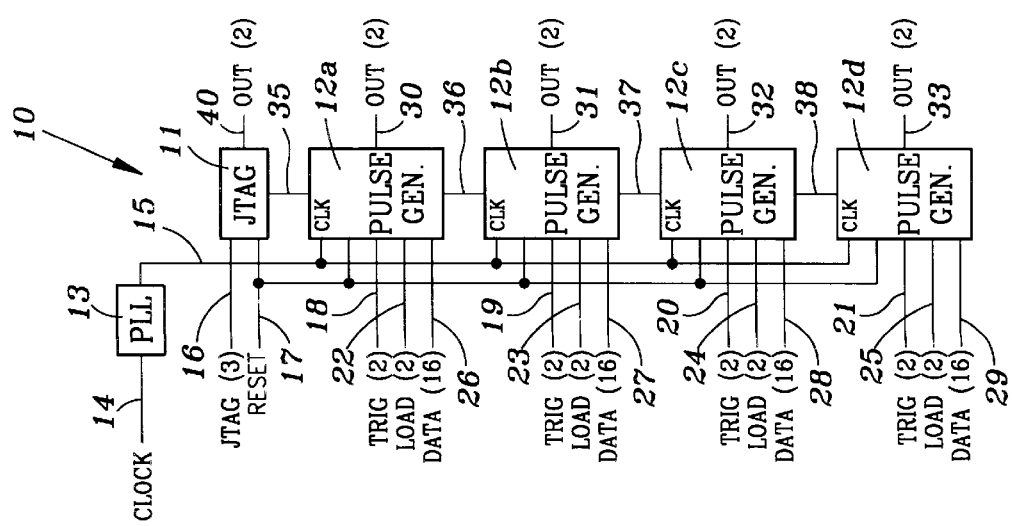
FIG. 2
FIG. 3
FIG. 1

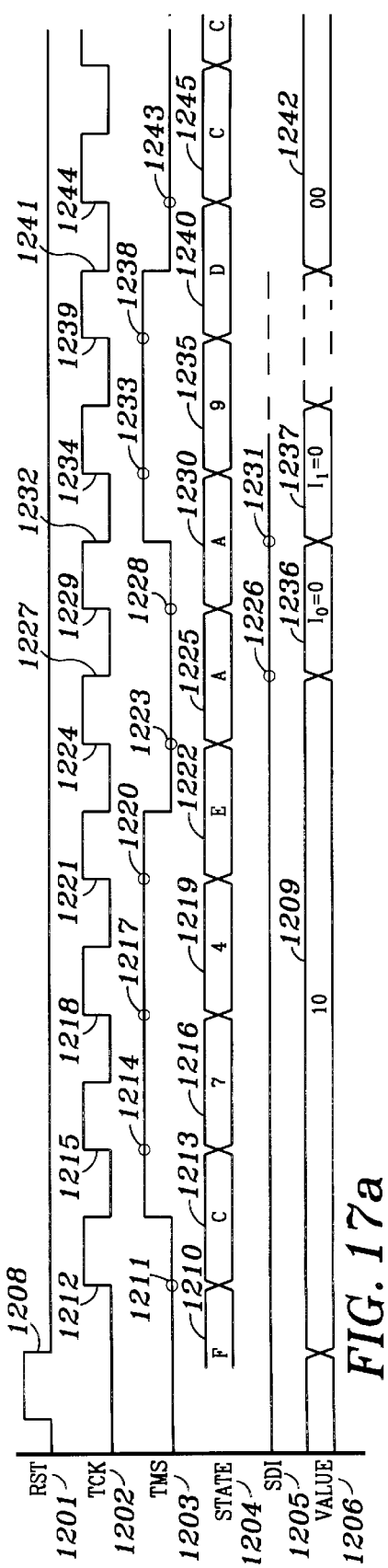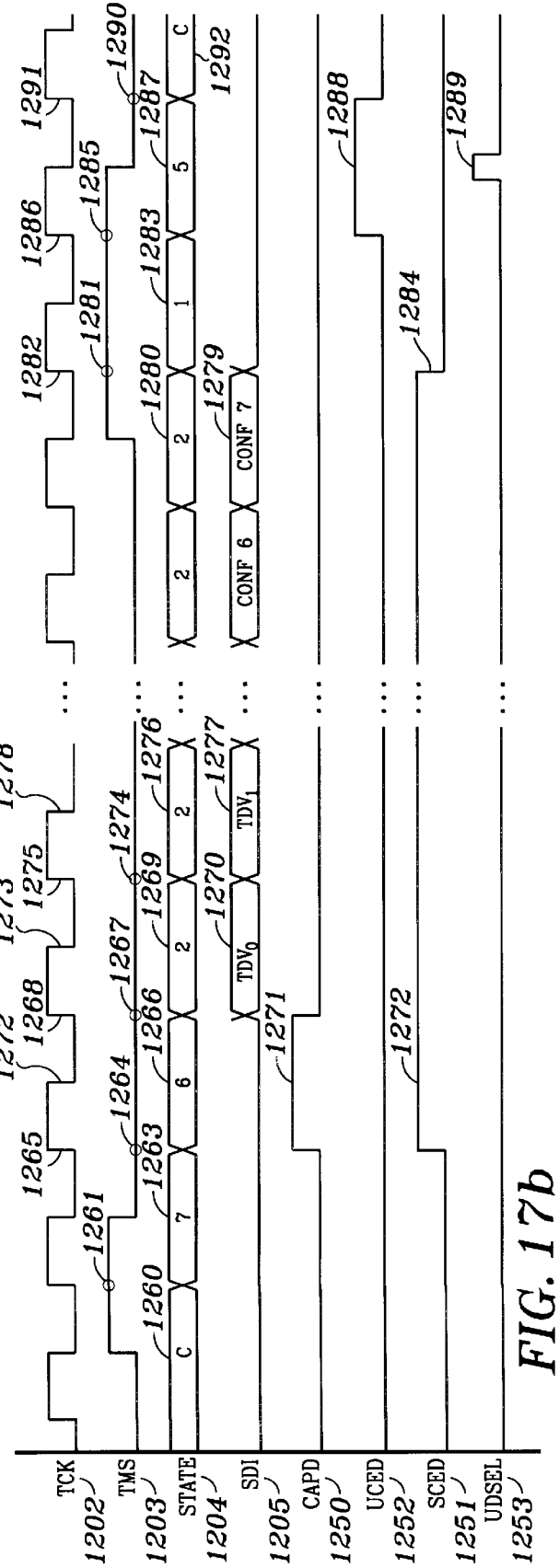

PROGRAMMABLE PULSE GENERATOR

RELATED APPLICATIONS

This Application is related to four U.S. patent applications Ser. No. 09/033,364 entitled "Tester Systems" Ser. No. 09/033,285 "Parametric Test System And Method", Ser. No. 09/032,958 entitled "Contact Test Method And System For Memory Testers", and Ser. No. 09/033,363 entitled "Microsequencer For Memory Test Systems", assigned to the assignee of the present invention, and filed on even date herewith.

FIELD OF THE INVENTION

The invention relates generally to sequencers for controlling the step by step operation of a memory module test system, and more particularly to a digital sequencer which generates pulses that are programmable in both pulse latency and trigger latency.

BACKGROUND OF THE INVENTION

Various systems have been used in the prior art to generate timing signals necessary for the operation and testing of CMOS Dynamic Random Access Memories (DRAMs). Among these systems are those which generate leading and trailing pulse edges for strobing row and column addresses and control signals. In addition, various analog and digital delay lines and programmable cycle delays have been used. These devices generally restrict the critical signal edges to clock boundaries, or delay them such that time losses of the order of a clock cycle may occur.

Other systems are known which generate a signal that is propagated along a delay chain, with the propagated signal being sampled periodically, and stored in leading and trailing edge registers. In such embodiments, multiplying and rounding are required to generate the leading and trailing edges.

U.S. Pat. No. 3,162,815 issued to Mogensen discloses a sequential pulse generator with independently adjustable pulse width and spacing that employs combinatorial logic, flip-flops and adjustable delay lines with each pulse output on a separate line.

U.S. Pat. No. 3,840,815 issued to Masters discloses a programmable pulse width generator incorporating a master clock, binary counters, a self-incrementing pulse width control, and a pulse combination circuit used to add component pulses into a single pulse. Pulse width is adjusted in increments of the master clock period by applying a hold condition when the pulse width reaches the desired amount, thus stopping the internal counters. Timing resolution for the system is specified as 2 $\mu$s (microsecond), which is not acceptable for DRAMs or SDRAMs typically having pulse widths of 10 to 30 nanoseconds.

U.S. Pat. No. 4,165,490 issued to Howe, Jr. et. al. discloses a clock pulse generator with adjustable pulse delay and pulse width control. A continuously running clock oscillator applies a stream of pulses to one or more adjustable-tap, coarse delay lines whose output in turn is applied to one or more finely adjustable delay lines. An additional "dither" delay is optionally added to provide further delay adjustment within half the time step of the preceeding delay lines. Selection of coarse, fine, and dither delay amounts, and selection of delay mode, is provided by a "latch ring" shift register.

U.S. Pat. No. 4,415,861 issued to Palmquist, et al discloses a programmable pulse generator wherein a trigger initiates a clocked sequential addressing of a pre-programmed high-speed memory from which stored 0's and 1's are read out as logic low and high levels. When the trailing edge is read out, the clocking is stopped and the addressing circuit is reset in preparation for the next trigger. An alternative embodiment creates a second pulse-generating section by duplicating the trigger and output circuits of the first pulse for the second pulse. The clocking, sequential addressing means, and pre-programmed high-speed memory are shared, and a second memory bit is read out. Either of the two programmable pulse sections may be independently or coincidentally triggered; however, because of the shared circuitry listed above, triggering of one section before the pulse in the other section has completed will result in an erroneous pulse.

U.S. Pat. No. 4,494,021 issued to Bell et al discloses a self-calibrated clock and timing signal generator for incorporation into MOS/VLSI circuitry. The disclosed circuit achieves self-calibration by creating a voltage-controlled oscillator (VCO) comprising five inverting voltage-controlled delay elements connected as a ring oscillator, and by incorporating the VCO in a phase-lock loop (PLL). When the PLL is locked to an externally supplied calibration reference frequency, and with the control voltage output of the phase detector of the PLL controlling the VCO also controlling a tapped delay line of identical inverting voltage-controlled delay elements, each element in the delay line has a delay equal to one-tenth of the period of the reference clock. The assumption made is that because both of the inverting voltage-controlled delay elements comprising the VCO are identical in construction and proximate to same elements of the delay line, voltage-to-delay characteristics of all such elements are nearly identical. This is a simple delay line with no capability for leading signal edge and trailing signal edge generation.

U.S. Pat. Nos. 5,208,598 and 5,224,129 issued to Lueker et al discloses a triggerable pulse generator incorporating a voltage-controlled oscillator (VCO). The oscillator generates pulses whose edge locations have a coarse location defined by the contents of a pre-programmed memory in increments of the VCO period. The increments are further refined by defined "slivers" in small digitally controlled increments, and defined "verniers" in yet smaller analog controlled increments. The resolution which is cited is 1 ps (picosecond). This system has no facility for dynamic alteration of pulse parameters, which is required in testing memory modules at their full operating speed.

DISTINCTIONS OVER ABOVE PRIOR ART

In contrast to the above prior art, the present invention 1) provides parallel ports for loading new leading and trailing latency values in a single I/O cycle as fast as pulses are completed; 2) includes a delay element chain reset signal, allowing a fast recovery time for closely-spaced pulses; 3) employs low-power CMOS technology chip instead of ECL technology (which exhibits high power consumption at any given speed); 4) incorporates all components of a programmable pulse generator into a single chip for higher reliability and circuit density; 5) allows latencies to be changed immediately on completion of a pulse, and thereby obviates the need for RAM storage of the pulse waveform; 6) embodies an all-digital design of higher-performance silicon without necessitating design change as faster ASIC technology becomes available, and dispenses with analog components and related trimming elements such as D/A converters.

The present invention also allows generation of pulses with respect to a reference system clock, and allows programmable pulse width and spacing in small increments relative to the period of the system clock. The timing resolution is better than 1 ns (one nanosecond). Further, the present invention is operable in either a triggered programmable pulse generator mode, or as a flow-through programmable delay line for repetitive signals. In addition, the pulse delay means of the present invention is directly programmable in 128 steps. The selection of latency and delay values, and the selection of modes incorporate a serial shift register separate from and in parallel connection with the selection registers. All or any bits thereby may change cleanly in one cycle.

SUMMARY OF THE INVENTION

A digital programmable delay which uses an asynchronous state machine to generate pulses in response to two delay cells, and which uses digital pipeline registers to either delay pulse generation or lengthen the latency of the pulses that are generated.

In one aspect of the invention, a serial shift register is used to test the operability of a complete gate delay chain.

In a further aspect of the invention, the timing of the leading edge and trailing edge signals of the generated pulse are independently programmable.

In another aspect of the invention, an asynchronous state machine is used to load data that is synchronous with one clock signal into a register, which operates in synchronization with another clock signal.

In a still further aspect of the invention, a programmable delay in the range of 0–63.5 nanoseconds typically may be provided in 0.5 nanosecond increments.

In a still further aspect of the invention, all sections of asynchronous and synchronous sections of the programmable pipeline delay chain of the pulse generator may be reset at the same time.

BRIEF DESCRIPTION OF THE DRAWINGS

The accompanying drawings, which are incorporated in and constitute a part of the specification, illustrate a preferred embodiment of the invention, and together with the general description given above and the detailed description of preferred embodiments given below serve to explain the principles of the invention.

FIG. 1 is a functional block diagram of an application specific integrated circuit (ASIC) in accordance with the invention;

FIG. 2 is a functional block diagram of a representative one of the pulse generators comprising the circuit of FIG. 1;

FIG. 3 is a functional block diagram of a representative one of the delay cells comprising the pulse generator of FIG. 2;

FIG. 7b is a timing diagram of the operation of configuration register 500 of FIG. 7a;

FIG. 8 is an electronic schematic diagram of a state machine comprising the pulse generator of FIG. 7a;

FIGS. 14a–14b illustrate a logic circuit diagram of one of the delay cells 501 and 502 of FIG. 7a;

FIG. 15 is a logic circuit diagram of the pipeline multiplexer 820 of FIG. 14a;

FIGS. 17a–17d are timing diagrams of the operation of the ASIC of FIG. 1.

DESCRIPTION OF PREFERRED EMBODIMENTS

Figure 4:
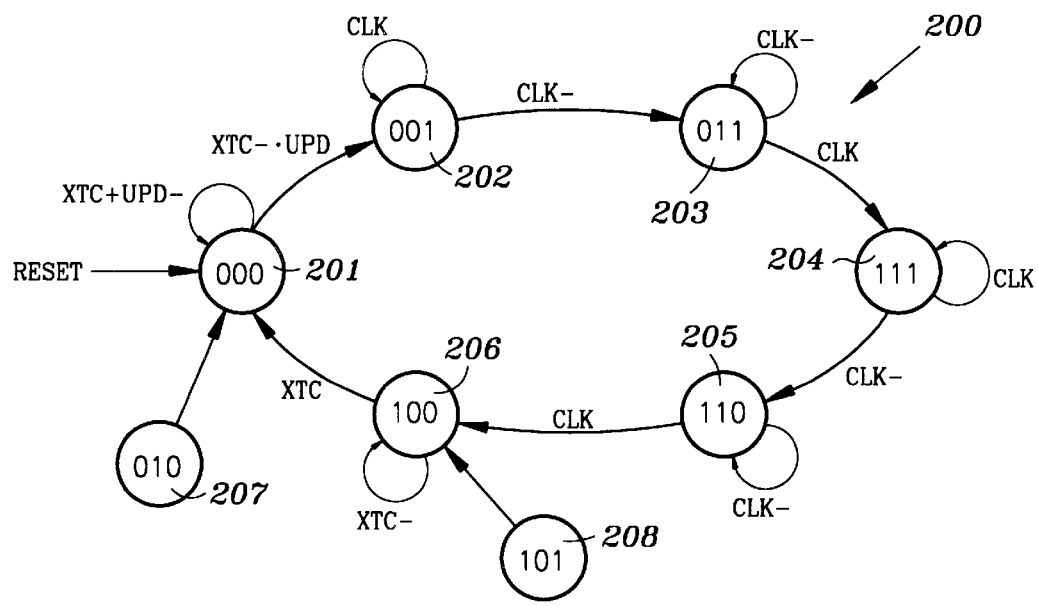
FIG. 4 is a state diagram of an asynchronous state machine comprising part of the JTAG interface 11 of FIG. 1.

The preferred embodiment of the invention is implemented in an application specific integrated circuit (ASIC) as illustrated in FIG. 1. In the following descriptions, the signal RESET is also referred to as RST, RST-, RSTA, RSTB, RSTB-, and RSTC. The descriptions of the ASIC refer to the following signals as defined in Table I below:

TABLE I

| SIGNAL NAME | DESCRIPTION |
| --- | --- |
| BYPCE | Bypass mode clock enable. Causes the test shift register chain to be bypassed to a minimum-length of one shift register. Activated by the JTAG BYPASS instruction. |
| C0 . . . C6 | Configuration signals emanating from the configuration register. Configuration register is loaded serially using the JTAG mechanism. |
| C7 | Configuration signal when low signifying the flow-through delay mode; when high signifying the pulse mode. |
| CAP | Capture signal originating in JTAG logic causing the test shift register to load the states of selected internal registers. |
| CAPC | CAP signal buffered for control section. |
| CAPD | CAP signal buffered for delay section. |
| CAPL | CAP signal buffered for leading edge delay section. |
| CAPT | CAP signal buffered for trailing edge delay section. |
| D0 . . . D7 | Delay value to be loaded into delay section. |
| DC | Delay Clear. Input on programmable delay section responsible for clearing the asynchronous portion of the delay line. Renamed as LCLR or TCLR, depending on whether leading edge or trailing edge delay section is specified, respectively. |
| DLE | Delay latch enable input. Loads value on D0 . . . D7 into delay section. |
| E0 . . . E64 | Enable. Test signals originating in JTAG section and sent in parallel to asynchronous portions of all delay lines. All E lines high during normal operation. |
| LATRST | Latch reset signal. When high, holds pulse generator asynchronous state machine in reset state, required when operating delay sections in "flow-through" mode. |
| LCLEAR | Signal from pulse generator state machine used to reset leading edge delay section. |
| LD0 . . . LD7 | Leading-edge delay value. |
| LEAD | Output of leading edge delay section. |
| LEAD- | Complement of LEAD signal. |
| LIN | Leading-edge delay trigger input. |
| LLE | Leading-edge delay latch enable. |
| PCLR- | Pipeline Clear. Signal used to clear the pipeline portion |

TABLE I-continued

| SIGNAL NAME | DESCRIPTION |
| --- | --- |
|  | of programmable delay section. Renamed as RSTB- or RSTC- depending on whether leading edge or trailing edge delay section is specified, respectively. |
| PULSE | Main output of pulse generator state machine going high with arrival of LEAD signal, and going low with arrival of TRAIL signal. |
| RSTA- | RST - signal buffered for control section. |
| RSTB- | RST - signal buffered for leading edge delay section. |
| RSTC- | RST - signal buffered for trailing edge delay section. |
| SCE | Shift clock enable input to delay section. |
| SCEC | SCED shift clock enable; buffered for control section. |
| SCED | Shift clock enable. When asserted allows the JTAG shift registers to shift from SDI to SDO. When quiescent, contents of JTAG shift registers do not change, irrespective of TCK signal. |
| SCEI- | Shift clock enable for JTAG instruction register. |
| SCEL | SCED signal buffered for leading edge delay section. |
| SCET | SCED signal buffered for trailing edge delay section. |
| SDI | Serial Data Input. Term for the input of any given section of the chain of JTAG shift registers. Derived from JTAG TDI signal. |
| SDO | Serial Data Output. Term for the output of any given section of the chain of JTAG shift registers. Becomes JTAG TDO signal. |
| TCK | Test clock signal in accordance with IEEE 1149.1-1990 JTAG standard, originating from and controlled by system processor. |
| TCLEAR | Signal from pulse generator state machine used to reset trailing edge delay section. |
| TCLK | Buffered equivalent of TCK signal. |
| TDI | Test data input. Serial test data signal in accordance with IEEE 1149.1-1990 JTAG standard; originating from system processor. Carries test and configuration data to the pulse generator. |
| TD0 . . . TD7 | Trailing-edge delay value. |
| TDO | Test data output. Serial test data signal in accordance with IEEE 1149.1-1990 JTAG standard; returned to system processor. |
| TDOOE | Output enable for JTAG TDO signal. |
| TIN | Trailing-edge delay trigger input. |
| TLE | Trailing-edge delay latch enable. |
| TMS | Test mode select signal in accordance with IEEE 1149.1-1990 JTAG standard, originating from and controlled by system processor. |
| UCED | Update clock enable. When asserted causes the configuration register to be loaded from the JTAG shift register. When in a quiescent state directs the configuration register contents to be unchanged irrespective of the toggling of the JTAG TCK signal. |
| UCEI | Buffered update clock enable. |
| UCET | Buffered update clock enable. |
| UDSEL | Update shift enable. |
| UDSL | Buffered update shift enable for leading-edge delay section. |
| UDST | Buffered update shift enable for trailing-edge delay section. |

Referring to FIG. 1, an ASIC 10 is shown that is comprised of an interface 11 which is an IEEE Joint Test Action Group (JTAG) interface, IEEE 1149.1-1990. The ASIC 10 also includes four pulse generators 12a, 12b, 12c, and 12d, and a phase lock loop 13.

The PLL 13 receives a clock signal from a system clock signal generator on a line 14, and in response thereto generates a noise-free signal on line 15 (without phase shift with respect to clock input 14) which is applied to the CLK inputs of pulse generators 12a, 12b, 12c, and 12d. In addition, the interface 11 receives JTAG TMS, TCK and TDI signals on line 16, and a reset signal on line 17 from a system processor which is not shown. The system processor also supplies leading edge and trailing edge trigger signals on each of lines 18, 19, 20 and 21, and leading edge and trailing edge load signals on lines 22, 23, 24, and 25, respectively to the pipeline registers of the delay cells comprising each of the pulse generators 12a, 12b, 12c, and 12d. In addition, the system processor provides 16 bits of data on lines 26, 27, 28, and 29 for controlling the pulse latency and trigger latency of pulses generated by the pulse generators 12a, 12b, 12c, and 12d, respectively on output lines 30, 31, 32, and 33.

The JTAG interface 11 also supplies a test data signal on line 35, which circulates by way of lines 35, 36, 37, and 38 through the pulse generators 12a 12b, 12c, and 12d, and then back to the JTAG interface 11. Once circulated through the pulse generators, the signal is output by JTAG 11 as a Test Data Out (TDO) signal on line 40 leading to the system processor. The system processor in turn compares the TDO signal on line 40 with values previously loaded to confirm the operability of the configuration and delay value registers within the pulse generators.

In operation, the PLL 13 adjusts ASIC internal clocks to be phase aligned with the clock signal received on line 14, and thereafter applies the clock signal to the CLK inputs of the pulse generators 12a, 12b, 12c, and 12d. The processor applies a load signal on lines 22, 23, 24 and 25 to load the data on lines 26, 27, 28, and 29 respectively into the pipeline register of pulse generators 12a, 12b, 12c, and 12d. Upon receipt of the trigger signal on lines 18, 19, 20, and 21, the pulse generators output pulses on output lines 30, 31, 32, and 33 which have the pulse latency and the trigger latency specified by the data previously loaded into the pulse generators from lines 26, 27, 28, and 29.

When the integrity of the data chain formed by the pulse generators is to be tested, a set of signals specified by the above identified IEEE standard is supplied by the system processor on line 16 to the JTAG interface 11, which in turn applies a test signal on line 35 that is circulated through the pulse generators by way of lines 35, 36, 37, and 38, to be output by the interface 11 as the TDO signal on line 40.

A pulse generator representative of those of FIG. 1 is illustrated in more detail in FIG. 2, where the pulse generator is comprised of a configuration register 50, a leading delay cell 51, a trailing delay cell 52, and a pulse controller 53. The registers 50 receive an input from the JTAG interface 11 of FIG. 1 by way line 54, which is in electrical communication with one of the lines 35, 36, 37, or 38 of FIG. 1. The eight bit test data output of the configuration registers is applied by way of a bus 55 to the test data inputs of delay cells 51 and 52. Cell 51 also receives a trigger signal on line 57 from one of lines 18, 19, 20, or 21 of FIG. 1, a load signal on line 58 from one of lines 22, 23, 24, or 25 of FIG. 1, and eight bits of leading edge delay value data on line 59 from one of lines 26, 27, 28, or 29 of FIG. 1. Cell 52 of FIG. 2 receives a trigger signal on line 60 from one of lines 18, 19, 20, and 21 of FIG. 1, a load signal on line 61 from one of lines 22, 23, 24, and 25 of FIG. 1, eight bits of trailing edge delay value data on line 62 from one of lines 26, 27, 28, or 29 of FIG. 1, and a JTAG signal on a line 63 from cell 51. In addition to a parallel delay value data load capability, cells 51 and 52 delay value data may also be loaded and read out serially using the JTAG facility. In addition, configuration registers 50 may only be loaded and read-out serially by the system processor. Cell 52 outputs a JTAG signal on a line 64 during test operations, and generates a signal on line 65 which defines the trailing edge of the pulse output by pulse controller 53 on a line 66. In like manner, the cell 51 outputs a signal on a line 67 which defines the leading edge of the pulse output by the pulse controller 53 on line 66. The pulse controller 53 also receives a mode control bit on line 68 from the configuration registers 50. After the pulse controller 53 generates the signals on line 66, and the inverse of such signals on a line 69, in response to the mode control line 68 and the inputs from the cells 51 and 52, the pulse controller issues clear signals on lines 70 and 71 to reset delay cells 52 and 51, respectively, and await a new trigger on lines 60 and 57.

In response to the load signals on lines 58 and 61 from the system processor, data supplied by the system processor on busses 59 and 62 is respectively loaded into cells 51 and 52. Further, in response to the JTAG signal on line 54, the configuration registers 50 supply the bit 7 control mode signal 68 to the pulse controller 53 to signify whether the cells 51 and 52 will be operating independently or in combination as the leading edge and trailing edge signal generators of a pulse to be produced by the pulse controller 53. If the cells are to operate in combination, the pulse edge determination signal output from cells 51 and 52 is supplied to the pulse controller 53 upon receipt of a trigger signal from the system processor on lines 57 and 60. In response to the leading and trailing edge defining signals from the cells, the pulse controller 53 issues a pulse or pulse train wherein each pulse has the pulse latency and trigger latency specified by the data on busses 59 and 62. An inverted output signal is supplied by the pulse controller on line 69.

If the mode bit on line 68 specifies an independent mode, the cells may be used independently to delay trigger signals appearing on lines 57 and 60, and output them on lines 66 and 69, respectively.

Upon generating the pulse or pulse train defined by the cells and the mode bit on line 68, the pulse controller 53 clears the cells of data by issuing clear signals on lines 70 and 71 and then awaits a new trigger from the system processor.

During a JTAG test, a test signal is applied by way of line 54, configuration registers 50, and line 56 to the test input of leading delay cell 51. The lest signal thereafter is circulated through the leading delay cell 51, line 63, trailing delay cell 52, to line 64 which is sensed by the system processor as the TDO signal on line 40 of FIG. 1 to test for proper operation of the pulse generator.

The leading delay cell 51 and trailing delay cell 52 are of equivalent construction, and are therefore disclosed in more detail in FIG. 3 by reference to only a delay cell 80. Referring to FIG. 3, the delay cell 80 is shown to be comprised of two digital pipeline registers 81 and 82 that are in electrical communication. The pipeline register 81 receives a three bit control code from the configuration registers 50 of FIG. 2 on line 84, a load signal from the system processor on line 85, and an eight bit delay value from the system processor on bus 86. Seven of the eight bits of data received by the register 81 are applied by way of bus 87 to the data input of a programmable delay chain 83, which typically may provide up to a 63.5 nanosecond delay in 0.5 nanosecond increments. Bit 8 of the data received by register 81 denotes whether or not an optional trigger latency will be introduced, and is applies to a control bit input of the register 82 by way of a line 88. Register 82 further receives a four bit control code on bus 89 from the configuration registers 50 of FIG. 2, and a trigger signal on line 90 from the system processor. After a delay specified by the four bit control code on live 89, the register 82 issues a trigger signal received by way of line 90 to the programmable delay chain 83 by way of a line 91. The delay specified by register 81 to indicate pulse latency thereupon is issued to the programmable delay chain by way of bus 87. Upon issuance of a pulse edge signal on output line 92, the pulse controller 53 of FIG. 2 issues a clear signal on line 93 as before described.

In operation, the four bit control code on line 89 to pipeline register 82 specifies the number of trigger latency clocks (0, 1, 2, 3, 4, 5, 6, or 7 clocks). Data defining the latency of a pulse is loaded from bus 86 into register 81, and bit 8 of the data issued by the pipeline register 81 to line 88 invokes an additional optional trigger latency clock. A trigger signal issued by the system processor is delayed by register 82 for a period of time specified by the latency control code on bus 89 and signal on line 88. If latency is not to occur, the trigger on line 90 is passed through register 82 without delay to the programmable delay chain 83. Upon receipt of the trigger signal, and after propagation times specified by register 81, the programmable delay chain 83 issues an output onto line 92.

While the JTAG interface 11 conforms to IEEE standard 1149.1-1990, there are a number of innovative features which have been added to the conventional implementation of the interface. One such innovation is an asynchronous state machine which allows data occurring synchronously with the JTAG clock to be loaded into a pipeline register of a delay cell under the control of the system clock, where the JTAG clock and the system clock are asynchronous.

Referring to FIG. 4, a state diagram 200 of an eight-state, asynchronous state machine used in the JTAG interface 11 is shown. The state machine uses three inputs (CLK, UPD, XTC), and three state variables X2, X1, and X0, which will be further explained below. State 000 at 201 is the reset or quiescent state, where the machine remains until the JTAG clock (XTC) is low and a positive update (UPD) occurs. At that time the state machine enters state 001 at 202, and remains there until the system clock (CLK) goes low. Upon the occurrence of a system clock low, the state machine moves to state 011 at 203, and remains there until the system clock goes high. At that time, the state machine enters state 111 at 204, and issues a clock enable signal to the pipeline registers of the pulse generators of FIGS. 1 and 2 that are synchronous with the system clock.

Upon the next occurrence of a system clock low, the state machine continues to issue a clock enable to load the leading delay cell 51 and trailing delay cell 52 from the JTAG interface 11 of FIGS. 1 and 2, enters state 110 at 205 of FIG. 4, and remains there until a system clock high occurs. At this time the state machine enters state 100 at 206, clock enable is de-asserted and remains there until a JTAG clock (XTC) high occurs. In that event, the state machine moves from state 100 to reenter state 000.

Two states, state 101 at 208 and state 010 at 207, are used to recover from invalid entry into states. In the event that the state machine enters state 010 at 207, by way of example, during a random power-up sequence, state 000 at 201 is thereby entered immediately, thus placing the state machine in a ready state. If the state machine enter state 101 at 208 during a random power-up sequence, state 100 at 206 is entered immediately, and operation proceeds as previously described.

The asynchronous state machine described above and used in the JTAG interface 11 of the preferred embodiment assumes a JTAG clock rate no faster than one-fourth that of the system clock, as the JTAG clock is driven by software.

Figure 5:
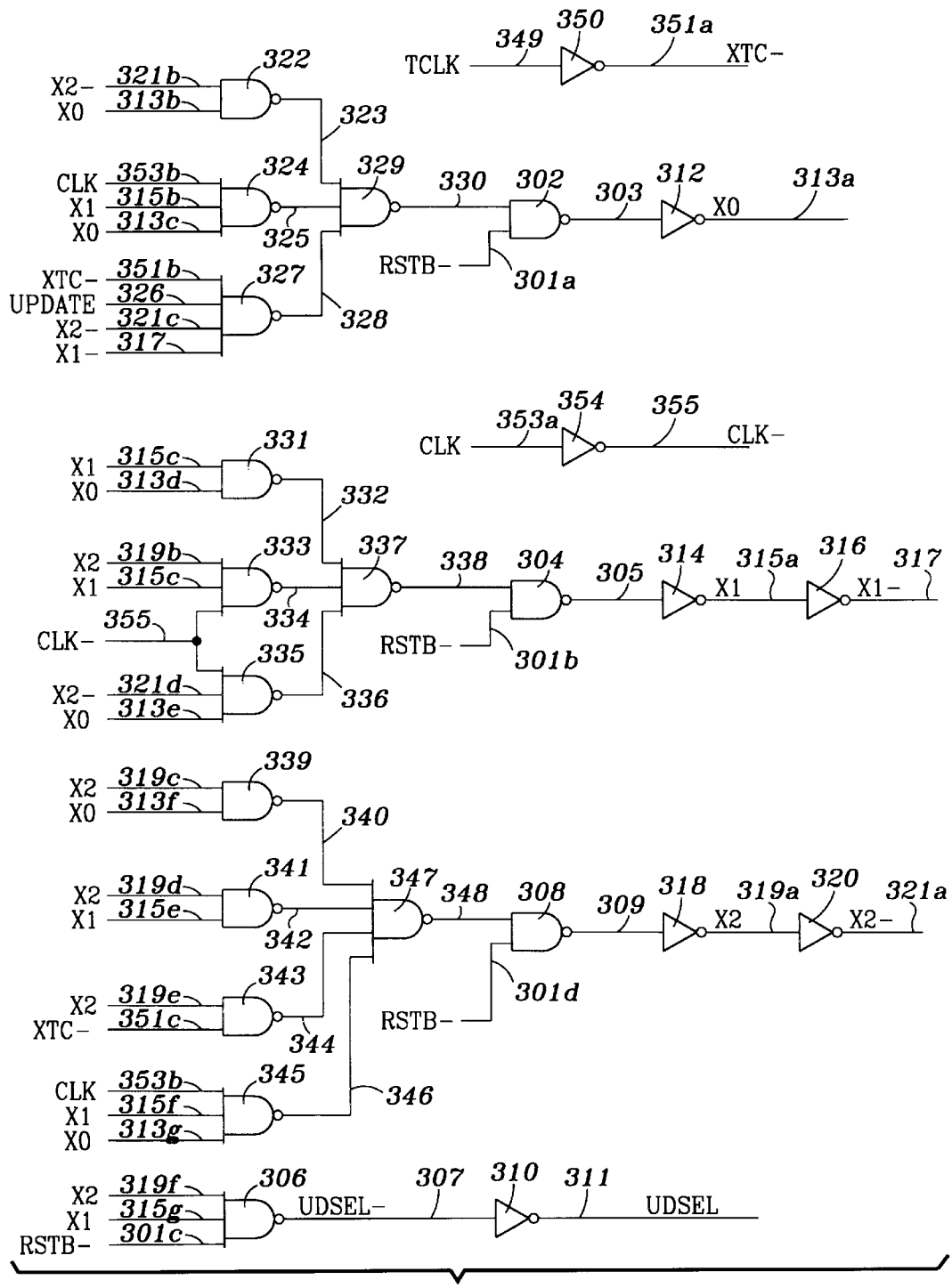
FIG. 5 is an electronic circuit diagram of the asynchronous state machine of FIG. 4.

FIG. 5 illustrates an asynchronous state machine 300 in logic diagram form that relates to the state diagram 200 of FIG. 4. Referring to FIGS. 4 and 5, the asynchronous state machine 300 is initialized during the reset period to state 000 at 201 when a signal on lines 301a–301d from the system processor is low. The propagation of the RESET signal through the asynchronous state machine 300 of FIG. 5 will now be described in detail.

The signal on lines 301a–301d is a buffered logical inverse of the reset signal received from the system processor. With the signal on lines 301a–301d is low, the outputs of NAND gates 302, 304, 306, and 308 on lines 303, 305, 307, and 309, respectively, are forced high. Inverter 310 thereupon applies a logic zero to a line 311, which is the output of the asynchronous state machine 300. With line 303 high, inverter 312 supplies a logic zero to line 313a. With line 305 high, inverter 314 applies a logic zero on line 315a. The inverter 316 thereupon outputs a logic one on line 317. When line 309 goes high, inverter 318 outputs a logic zero to line 319a, and inverter 320 supplies a logic one to line 321a. Thus, lines 313a, 315a, and 319a represent the three state bits of the state machine, which is held in state 000 at 201 of FIG. 4.

With line 313b leading to an input of NAND gate 322 low, the output of NAND gate 322 on line 323 is forced high. When inputs on lines 315b and 313c to NAND gate 324 are both low, the output of NAND gate 324 on line 325 is forced high. If the input on line 326 is in a quiescent low state (not asserted), the output of NAND gate 327 or, line 328 is forced high. The simultaneous high states of all three inputs to NAND gate 329 causes the output of the gate to become low on line 330, thus holding the output of gate 302 high. In a like manner, when inputs on line 315c and 313d to NAND gate 331 are low, the output of gate 331 on line 332 goes high. Continuing, when the inputs on lines 315d and 319b to NAND gate 333 are low, the output of the gate on line 334 is forced high. If the input on line 313e to NAND gate 335 is low, the output of NAND gate 335 on line 336 is high. With inputs 332, 334, and 336 all high, NAND gate 337 outputs a logic zero on line 338 to cause the output of NAND gate 304 to go high. In a like manner, with inputs 313f and 319c to NAND gate 339 at a logic zero, the output of NAND gate 339 on line 340 is forced to a logic one. With inputs on lines 315e and 319d to NAND gate 341 at a logic zero, the output of gate 341 on line 342 is raised to a logic one. With inputs 319e and 351 to NAND gate 343 at a logic zero, the output of gate 343 on line 344 is forced high. Upon inputs 313g and 315f to NAND gate 345 transitioning to a logic zero, the output of gate 345 on line 346 rises to a logic one level. When inputs 340, 342, 344, and 346 to NAND gate 347 are at a logic one level, NAND gate 347 outputs a logic zero on line 348 to hold the output of NAND gate 308 at a logic one level. From the above discussion of the propagation of the RESET signal through the asynchronous state machine 300, it can be seen that the reset condition will persist after the RESET signal on lines 301a–301d is returned to its quiescent high or logic one state.

In the schematic of FIG. 5, the three digit states of the state machine are indicated by the logic levels on lines 319, 315a, and 313, which are the output lines of the state machine. Line 319 indicates the first digit, line 315a the second digit, and line 313 the third digit. The digits are referred to as X2, X1, and X0.

Figure 6:
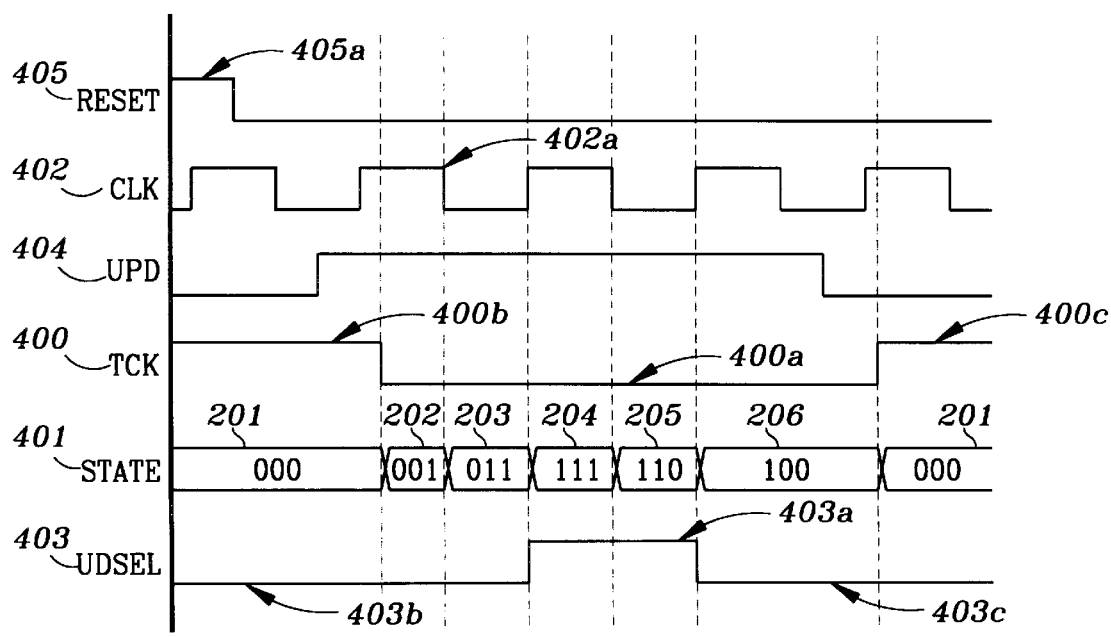
FIG. 6 is a timing diagram of the operation of the asynchronous state machine of FIG. 4.

The primary inputs controlling the operation of the state machine, as illustrated in FIG. 6, are the RESET signal on lines 301a–301d of FIG. 5 and represented as waveform 405 of FIG. 6, the system clock on line 353a and 353b of FIG. 5 and represented as waveform 402 of FIG. 6, the UPD (update) signal on line 326 of FIG. 5 and represented as waveform 404 of FIG. 6, the JTAG clock on line 349 of FIG. 5 and represented as waveform 400 (TCK) of FIG. 6, and the UDSEL (update shift enable) signal on line 311 of FIG. 5 and represented as waveform 403 of FIG. 6.

Referring now to FIGS. 4 and 6, when the JTAG clock signal TCK (which also is referred to herein as the JTAG clock signal XTC in connection with the description of the state machine diagram of FIG. 4) goes high while signal UPD is high, asynchronous state machine 300 transitions from state 000 at 201 to state 001 at 202. Referring to FIG. 5, the JTAG clock TCK on line 349 is inverted by an inverter 350 and presented by way of lines 351a and 351b to an input of NAND gate 327. When the UPD signal on line 326 goes high, gate 327 has four inputs at a logic one level. The output of the gate 327 on line 328 thus is forced to go low. The output of NAND gate 329 thereupon goes high on line 330. With the RESET signal de-asserted, the lines 301a–301d go high, and the output of NAND gate 302 on line 303 is at a logic zero. The output of inverter 312 thus transitions to a logic one on line 313a, thereby bringing asynchronous state machine 300 to state 001 at 202.

Referring to FIGS. 4, 5, and 6, with asynchronous state machine 300 in state 001 at 202 of FIG. 4, the signal X0 on line 313a is high, and the signals X2 on line 319a and X1 on line 315a of FIG. 5 are both low. The X0 and X2-inputs to NAND gate 335 thus are high. With the system clock (CLK) on line 353 high, inverter 354 outputs an inverted CLK– signal on line 355, and the output of NAND gate 335 on line 336 remains high, as during the reset period. However, after the next transition of the system clock (CLK) on line 353 from a high to a low, the inverted CLK– signal on line 355 goes high. All three inputs to NAND gate 335 thus are high or at a logic one level to cause line 336 to go low, and force the output of NAND gate 337 on line 338 to a high state. With the RESET signal de-asserted, lines 301a–301d are high, and the output of gate 304 goes low on line 305. The output of inverter 314 on line 315a, the X1 signal, thus transitions to a logic one level, and the output of inverter 316 on line 317 is low or at a logic zero state. The asynchronous state machine 300 thereupon enters state 011 at 203.

Continuing with the description of FIGS. 4, 5, and 6, with asynchronous state machine 300 in state 011 at 203 of FIG. 4, X0 signal on lines 313a–313b and the X2– signal on line 321b are both high at the inputs to NAND gate 322. The output of gate 322 on line 323 thereupon is forced low, and both the output of gate 329 on line 330 and the RESET signal on line 301 are high. The low output of gate 302 on line 303 is further inverted by inverter 312 to make the signal X0 on line 313a high. With one input to NAND gate 329 low from the output of NAND gate 322, the outputs of gates 324 and 327 are ignored. Simultaneously, the signal X0 on line 313d and the signal X1 on line 315c are both high at the inputs to gate 331, the output of which is forced low. The output of gate 337 on line 338 thus transitions to a logic one level. With the RESET– signal on line 301b high, the output of gate 304 is forced low on line 305 and inverted by inverter 314 to make the signal X1 on line 315a high. With one input to gate 337 low from the output of NAND gate 331, the outputs of NAND gates 333 and 335 are ignored. With the system clock (CLK) on line 353b low, the output of gate 345 on line 346 remains high, as during the reset period. However, after the next transition of the system clock (CLK) on line 353b from a low to a high, and with the signal X0 on line 313g and the signal X1 on line 315f high, all three inputs to gate 345 become high. The output of gate 345 on line 346 goes low, and thus NAND gate 347 supplies a logic one state on 348. With the RESET– signal de-asserted, and with line 301d high, the output of NAND gate 308 forces line 309 low. The output of inverter 318 (X2) on line 319a thus transitions to a high, thereby bringing asynchronous state machine 300 to state 111 at 204 of FIG. 4.

With the asynchronous state machine 300 in state 111 at 204 of FIG. 4, the X1 signal on line 315g, the X2 signal on line 319f, and the RESET− signal on line 301c are all high inputs to NAND gate 306. The output of NAND gate 306 on line 307 thus goes low, and is applied through inverter 310 to supply the signal UDSEL on line 311 in a logic one state. It is desired to remain in state 111 of FIG. 4 while the system clock (CLK) on line 353 remains high, and enter state 110 when the system clock (CLK) transitions from a high to a low state.

In state 111 at 204 of FIG. 4, signals X0 on line 313c, X1 on line 315b, and the system clock (CLK) on line 353a are all high as inputs to gate 324, thus causing the gate 324 output on line 325 to go low. The NAND gate 329 output on line 330 thus is forced high. The output of NAND gate 302 transitions to a logic zero or low state on line 303, which is inverted by inverter 312 to become the X0 signal on line 313a. Signals X1 on line 315a and X2 on line 319a remain unchanged in their high states. However, when the system clock (CLK) on line 353a goes low, gate 324 outputs a logic one signal on line 325, and with the outputs of NAND gates 322 and 327 already high, the output of NAND gate 329 goes low on line 330. The output of NAND gate 302 thus transitions to a high state which is inverted by inverter 312 to become the signal X0 on line 313a in a logic zero state. The asynchronous state machine 300 thus enters state 110 at 205.

With the asynchronous state machine 300 in state 110 at 205 of FIG. 4, the X1 signal on line 315g, and the X2 signal on line 319f, and the RESET signal on line 301c are high to NAND gate 306 whose output on line 307 is at a logic zero voltage level. The output of NAND gate 306 is applied through inverter 310 to provide a logic one UDSEL signal on line 311. It is desired to remain in state 110 while the system clock signal (CLK) on line 353a remains low, and enter state 100 when the system clock transitions from low to high. In state 110 at 205 of FIG. 4, the X1 signal on line 315d, the X2 signal on line 319b, and the system clock on line 355 are all high as inputs to NAND gate 333. The output of NAND gate 333 on line 334 thus transitions to a logic zero state and the output of NAND gate 337 goes high. With the RESET− signal on line 301b high, the output of gate 304 will be at a logic zero on line 305 which is passed through inverter 314 to raise the signal X1 on line 315a to a logic one state. However, when the system clock (CLK−) signal on line 355 goes low, the output of gate 333 transitions to a logic one state on line 334. With the outputs of NAND gates 331 and 335 already high, the output of NAND gate 337 transitions to a logic zero state on line 338. The output of a NAND gate 304 thus transitions to a logic one state on line 305, and is passed through inverter 314 to make signal X1 on line 315 go low. The asynchronous state machine 300 of FIG. 5 thus enters state 100 at 206 of FIG. 4. With the X2 signal on 319f leading to an input of gate 306 now low, the output of NAND gate 306 on line 307 goes high, and is passed through inverter 310 to cause the UDSEL signal on line 311 to return to its quiescent low state.

It is desired to remain in state 100 at 206 of FIG. 4 while the JTAG clock signal (TCK) on line 349 remains low, and to return to state 000 when the TCK signal on line 349 of FIG. 5 transitions from a low to a high state. In state 100 at 206 of FIG. 4, with the X2 signal on line 319e and the JTAG clock signal on line 351c of FIG. 5 it a logic one, the output of NAND gate 343 on line 344 is low. The output of gate 347 thus remains high as for the previous state. However, when the JTAG clock signal (TCK) on line 349 transitions from low to high, line 351a transitions from high to low to force the output of NAND gate 343 on line 344 to go high. With the outputs of NAND gates 339, 341, and 345 already high, the output of NAND gate 347 on line 348 goes low. The output of NAND gate 308 on line 309 goes high. The signal X2 on line 319a thus goes low to return the state machine to state 000 at 201 of FIG. 4. It should be noted that in the event that the JTAG clock signal (TCK) on line 349 of FIG. 5 is already high during state 110 at 205 of FIG. 4, state 100 at 206 will persist for only the time of the propagation delay of the gates, typically a few nanoseconds, before making an immediate transition to state 000 at 201.

In the unlikely event that unused state 010 at 207 occurs as a result of a random power-up condition of asynchronous state machine 300 of FIG. 5, it can be seen that the corresponding combination of a logic zero X0 signal on lines 313a–313g, a logic one X1 signal on lines 315a–315g, and a logic zero X2 signal on lines 319a–319f is not decoded by any of the NAND gates 322, 324, 327, 331, 333, 335, 339, 341, 343, and 345. Therefore, the X1 signal on line 315a will go low to signify state 000 at 201 of FIG. 4. Further, in the unlikely event that unused state 101 at 208 occurs as a result of a random power-up condition of asynchronous state machine 300, it can be seen that the corresponding combination of the X0 signal on line 313a–313g at a logic one, the X1 signal on lines 315a–315g at a logic zero, and the X2 signal on line 319 at a logic one level, is not decoded by any of the NAND gates 322, 324, and 327. Therefore, the X0 signal on lines 313a–313g will go low to signify that the state machine has entered state 100 at 206. The operation of the state machine then proceeds as previously described.

Referring to FIG. 6, it is seen that with the signal UPD of waveform 404 high during the time that the JTAG clock (TCK) of waveform 400 is low as indicated at 400a, the state machine leaves the quiescent state 000 of 201 and enters state 001 at 202. The state machine then circulates through state 001 at 202, state 011 at 203, state 111 at 204, state 110 at 205, and state 100 at 206 as illustrated by waveform 401. When the JTAG clock (TCK) is high as shown at 400b and 400c, the state machine respectively leaves and reenters state 000 at 201. The TCK clock signal of waveform 400 is shown to have about one quarter the frequency, and to be asynchronous with the system clock of waveform 402.

Upon the occurrence of a system clock low at 402a of waveform 402, the state machine moves from state 001 at 202 to state 011 at 203 of waveform 401, and remains there until the system clock again goes high. In that event, the state machine enters state 111 at 204, and, as indicated at 403a of waveform 403, issues a clock enable signal to a pipeline register such as registers 81 and 82 of FIG. 3, that are synchronous with the system clock. The pulse 403a occurs over a system clock cycle. During the time periods that the UDSEL signal is low or at a logic zero as indicated at 403b and 403c, the state machine looks to the JTAG clock of waveform 400.

When a RESET pulse 405a occurs, the state machine enters state 000 at 201 of waveform 401. To pass from state 000 at 201 to state 001 at 202, however, the JTAG clock (TCK) of waveform 400 must be at a logic zero, and the UPD (update) signal of waveform 404 must be at a logic one. Further, to pass from state 100 at 206 to state 000 at 201, the UPD signal of waveform 404 must be at a logic zero, and the JTAG clock (TCK) signal of waveform 400 must be at a logic one.

Figure 7A:
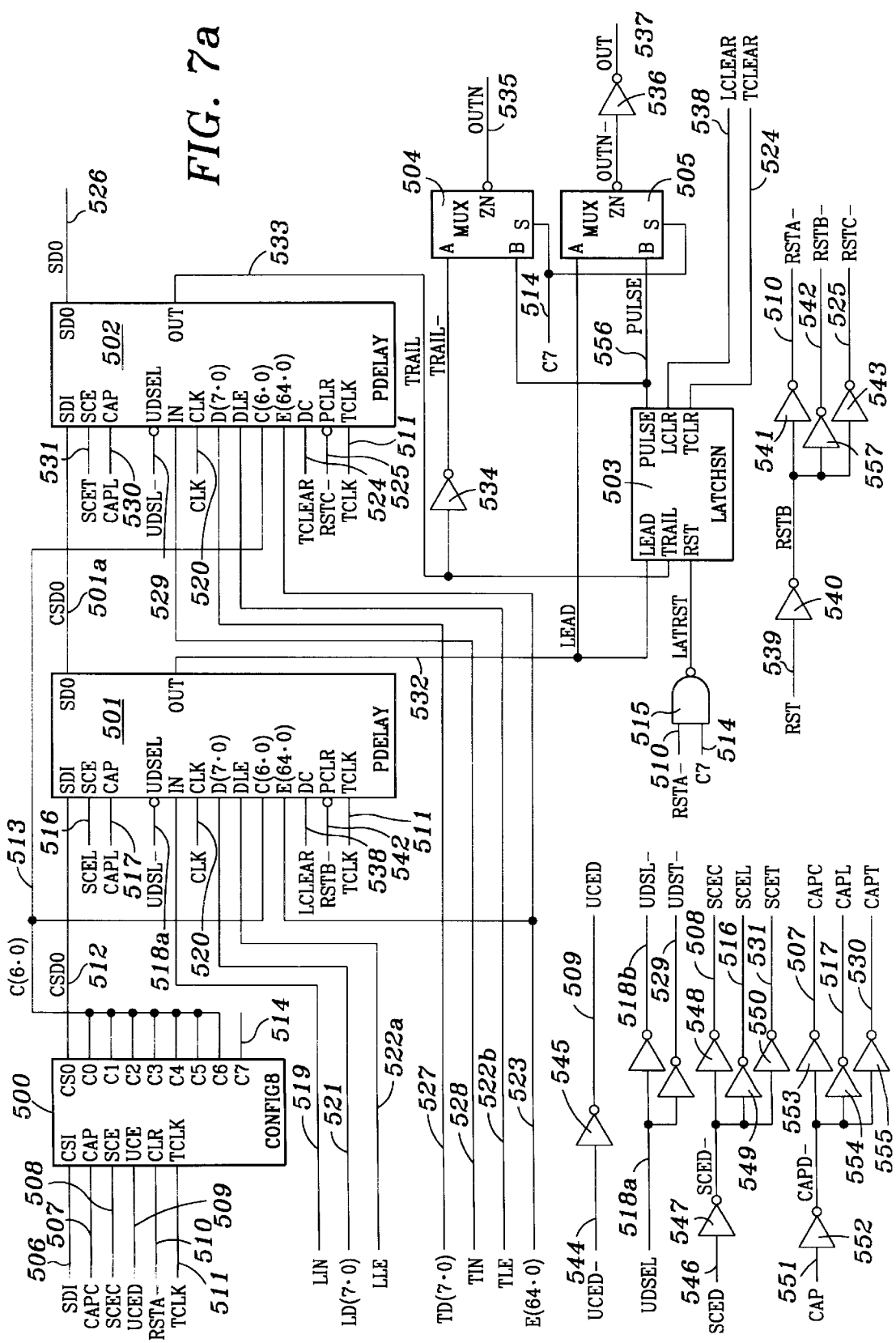
FIG. 7a is a detailed electronic circuit diagram of the pulse generator of FIG. 2.

In FIG. 7a, a representative one of pulse generators 12a, 12b, 12c, and 12d of FIG. 1 is shown. Looking to FIG. 7a, a pulse generator is shown as comprised of an eight bit configuration register 500, a leading delay cell 501, a trailing delay cell 502, a state machine 503, and multiplexers 504 and 505. The configuration register 500 receives serial data on a line 506 at its CSI input, a capture control signal on a line 507 at its CAP input, a shift enable signal on a line 508 at its SCE input, an update clock enable signal on a line 509 at its UCE input, a reset signal on a line 510 at its inverted PCLR input, and a test clock signal on a line 511 at its TCLK input.

The JTAG serial data output of configuration register 500 is applied by way of a line 512 to the test data input of leading delay cell 501. The configuration signal outputs C0–C6 of register 500 are applied by way of a bus 513 to the configuration data inputs C[6-0] of leading delay cell 501 and trailing delay cell 502. The C7 configuration bit output of register 500 is applied along a line 514 to one input of a NAND gate 515, and to the SELECT inputs of multiplexers 504 and 505.

The leading delay cell 501 also receives a shift enable signal on a line 516 at its SCE input, a capture signal on a line 517 at its CAP input, a buffered update shift enable signal on a line 518a at its inverted UDSEL input, a load input signal on a line 519 at its IN input, the system clock signal on a line 520 at its CLK input, an eight bit delay value on a line 521 at its D[7-0] input, a delay enable signal on a line 522a at its DLE input, a sixty-five bit test enable word on a bus at its E[64-0] input, a clear signal on a line 524 at its DC input, a reset signal on a line 525 at its inverted PCLR input, and the JTAG clock signal on line 511 at its TCLK input. The JTAG serial data output of delay cell 502 is applied to a line 526 leading to either a next one of pulse generators 12a, 12b, 12c, or 12d, or to the JTAG interface 11 to form a TDO signal on line 40 of FIG. 1 for further processing by the system processor.

The trailing delay cell 502 receives a delay enable signal on a line 527 at its DLE input, the system clock signal on line 520 at its CLK input, a trailing delay value on a line 528 at its IN input, a buffered update shift enable signal on a line 529 sit its inverted UDSEL input, a capture signal on a line 530 at its CAP input, a shift clock enable signal on a line 531 at its SDI input.

The leading pulse edge signal supplied at the output of delay cell 501 is applied along a line 532 to the leading edge input of state machine 503, and to the A input of multiplexer 505. The trailing pulse edge signal supplied by the trailing delay cell 502 is applied by way of a line 533 to the trailing edge input of state machine 503, and through an inverter 534 to the A input of multiplexer 504.

The output of NAND gate 515 is applied to the reset input of state machine 503, and the pulse output of the state machine 503 is electrically connected to the B inputs of multiplexers 504 and 505. The inverted output of multiplexer 504 is applied to an output line 535 to provide a trailing edge signal, and the inverted output of multiplexer 505 is applied through an inverter 536 to an output line 537 to provide a leading edge signal.

The LCLR output of state machine 503 is applied to a line 538 leading to the DC input of leading delay cell 501, and the TCLR output of state machine 503 is applied to line 524 as before described. The system processor supplies an inverted reset signal on a line 539, which is applied through an inverter 540 and an inverter 541 to line 510 leading to a second input of NAND gate 515. The output of inverter 540 also is applied through an inverter 557 to a line 542 leading to the PCLR input of leading delay cell 501, and through inverter 543 to line 525 leading to the PCLR input of trailing delay cell 502.

The JTAG interface 11 of FIG. 1 further supplies an update clock enable signal on a line 544 of FIG. 7a, which in turn is applied through an inverter 545 to line 509. In addition, the JATAG interface 11 supplies a shift clock enable signal on a line 546 that is applied through an inverter 547 to inputs of inverters 548, 549, and 550. The output of inverter 548 is applied to line 508, and the output of inverter 549 is applied to line 516. The output of inverter 550 is applied along line 531 to the shift clock enable (SCE) input of trailing delay cell 502. The JTAG interface also supplies a capture signal on line 551 which is applied through inverter 552 to the inputs of inverters 553, 554, and 555. The output of inverter 553 is applied to line 507 leading to the CAP input of configuration registers 500. The output of inverter 554 is applied to line 517 leading to the CAP input of leading delay cell 501, and the output of inverter 555 is applied to line 530 leading to the CAP input of trailing delay cell 502.

In operation, the system processor issues a RESET signal on line 539 to set the state machine 503 in a quiescent state 000, and to clear the configuration register 500, the leading delay cell 501, and the trailing delay cell 502. Thereafter, the system processor, through JTAG instruction sequences, issues an update clock enable (UCED) signal on line 544 and a shift clock enable (SCE) signal on line 546 to cause configuration register 500 to be loaded from the JTAG interface 11 of FIG. 1. In response thereto, eight bits of configuration data are loaded by way of the JTAG interface 11 of FIG. 1 into the serial data input (SDI) of configuration register 500 of FIG. 7a under control of the JTAG clock (TCLK) on line 511. The system processor also issues a logic one signal on line 522a to load an eight bit delay value on bus 521 into leading delay cell 501, and a logic one signal on line 522b to load an eight bit delay value on bus 527 into trailing delay cell 502. Seven bits of configuration data (C0–C6) thereafter are loaded under control of the JTAG clock into delay cells 501 and 502 to select a pulse latency and a trigger latency. The configuration bits provide codes to the pipeline registers of the delay cells as before described in connection with FIG. 3. In response thereto, the state machine 503 issues a pulse to the B inputs of multiplexers 504 and 505. If the C7 bit output of register 500 is high, the multiplexers 504 and 505 are switched to the pulse output of state machine 503 so that the pulse appears on line 537, and the inverse of the pulse appears on line 535. In the alternative, when the C7 output is low, the multiplexer 504 is switched to receive the inversion of the trailing edge signal at the output of the delay cell 502, and the multiplexer 505 is switched to receive the leading edge signal from leading delay cell 501 on line 532.

In response to the output of leading delay cell 501 on line 532, the state machine 503 issues a clear signal on line 538 to clear the final stage of the leading edge trigger pipeline and the asynchronous portions of the delay cell 501. In like manner, in response to the output of trailing delay cell 502 on line 533, the state machine 503 issues a clear signal on line 524 to clear the final stage of the trailing edge trigger pipeline and the asynchronous portions of the trailing delay cell 502.

During the above described operation of the pulse generator of FIG. 7a, the test signals on line 523 remain high.

Figure 7B:
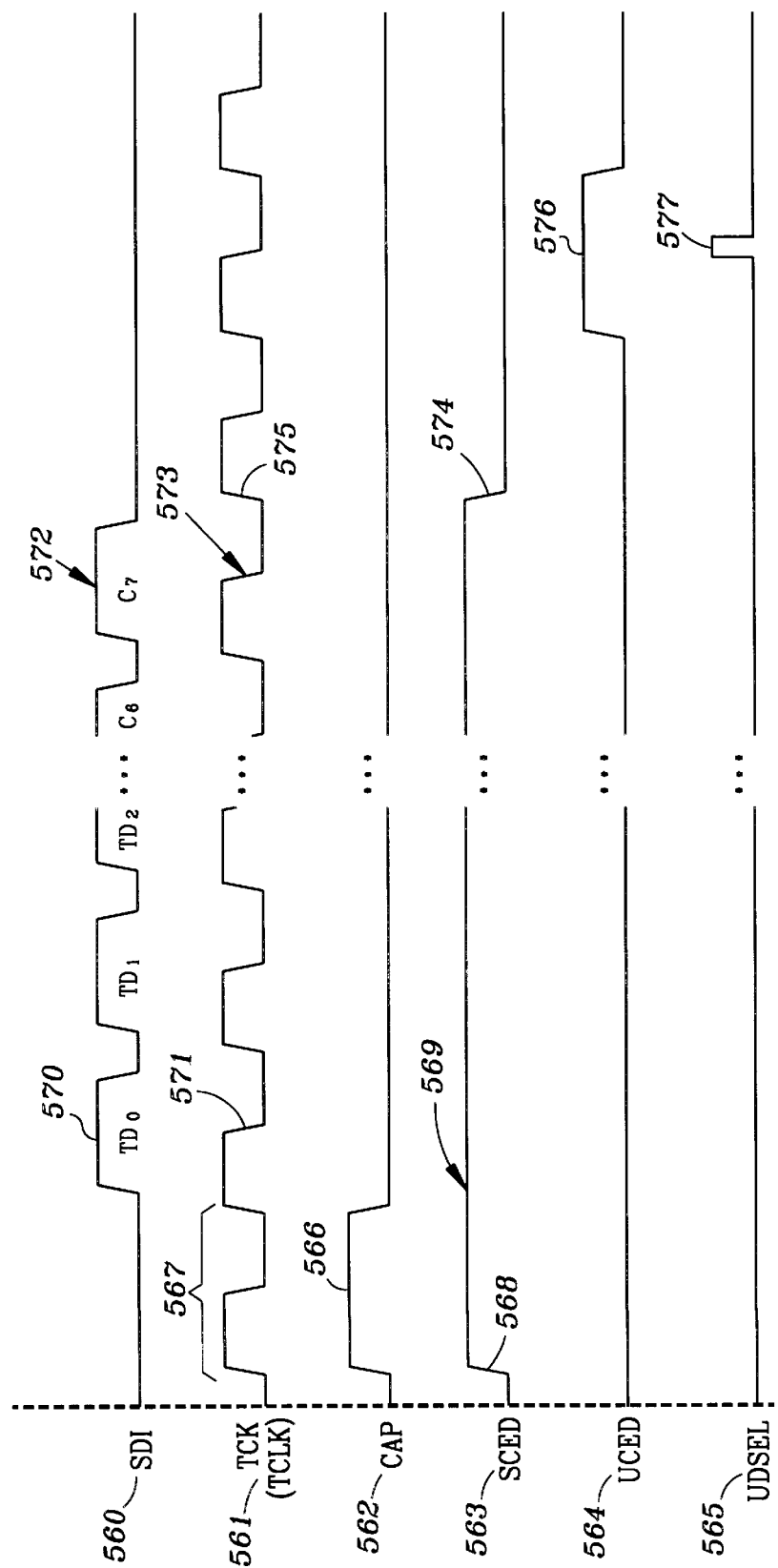

Referring to FIGS. 7a and 7b, several control signals are inverted and/or buffered before application to configuration registers 500, leading delay cell 501, and trailing cell 502.

The process of inversion and/or buffering does not affect the description of the signal, hence only the source signals are depicted in waveforms and described. Signal UCED on line 509 is derived from source signal UCED– on line 544; signals UDSL– on line 518b and UDST– on line 529 are derived from source signal UDSEL on line 518a; signals SCEC on line 508, SCEL on line 516, and SCET on line 531 are derived from source signal SCED on line 546; signals CAPC on line 507, CAPL on line 517, and CAPT on line 530 are derived from source signal CAP on line 551; and signals RSTA– on line 510, RSTB– on line 542, and RSTC– on line 525 are derived from RST– on line 539.

Following the application of signal RST– on line 539, the contents of the configuration register 500 are zero. It is therefore necessary to initialize the register before operating delay cells 501 and 502. FIG. 7b shows signals SDI on line 506 as waveform 560, TCK (TCLK) on line 511 as waveform 561, CAP on line 551 as waveform 562, SCED on line 546 as waveform 563, and UCED on line 509 of FIG. 7a as waveform 564 originating from the JTAG interface 11 of FIG. 1. The signal UDSEL on line 518 is shown as waveform 565, and is triggered by the UCED signal of waveform 564, and synchronized to the system clock CLK 520 in the JTAG asynchronous state machine of FIGS. 4, 5 and 6.

In synchronization with the JTAG clock TCK (TCLK) of waveform 561, the JTAG interface 11 of FIG. 1 asserts CAP signal pulse 566 of waveform 562 of FIG. 7b for one TCK (TCLK) clock period as indicated at 567 of waveform 561. The configuration register 500, leading delay cell 501, and trailing delay cell 502 of FIG. 7a thereby are triggered to "capture" their contents respectively, into their internal serial JTAG shift registers. In accordance with JTAG architecture, the captured data is shifted serially from register 500 to leading delay cell 501 by way of line 512, and from leading delay cell 501 to trailing delay cell 502 by way of line 501a, and from trailing delay cell 502 to the SD0 line 526. Further, the JTAG interface 11 of FIG. 1 may shift data serially over SDI line 506 into the three serial shift registers, while old data is shifted out serially onto the SDO line 526 for subsystem test and verification purposes.

Returning to FIG. 7b, the signal SCED of wave form 563 is generated by the JTAG interface 11 of FIG. 1, and is asserted at the leading edge 568 of pulse 569 of FIG. 7b, concurrently with the leading edge of the CAP pulse 566 of waveform 562. Thereafter, for as many periods of the TCK (TCLK) signal of waveform 561 as there are data bits to be shifted into the SDI input of register 500. The SDI signal on line 506 is first driven with the value of the least-significant bit of the trailing edge delay value at 573 of waveform 560, and is clocked into the chain of JTAG shift registers during the falling edge of the TCK (TCLK) signal of waveform 561 at 571. In a similar manner, the remaining seven (7) bits of the trailing edge delay value 570, the eight bits of the leading edge delay value beginning with the lease significant bit, and the eight bits of the configuration register beginning with the first bit are clocked in. After the most-significant bit C7 of the configuration register at 572 of waveform 560 is clocked in at 573 of waveform 561, the SCED signal of waveform 563 is de-asserted at 574 on the next rising edge 575 of the TCK (TCLK) waveform 561. Upon the occurrence of rising edge 575, the UCED signal of waveform 564 is asserted for one TCK (TCLK) clock period at 576 of waveform 564, and sent to the JTAG asynchronous state machine 300 of FIGS. 4, 5 and 6 for synchronization with the system clock CLK on line 520 of FIG. 7a. Thereafter, the pulse 576 of FIG. 7b is returned at 577 of waveform 565 with a pulse width of one cycle of the system clock CLK on line 520 of FIG. 7a. The pulse 577 of waveform 565 in turn signals the configuration cell 500, leading delay cell 501 and trailing delay cell 502 to "update" their contents from their respective JTAG serial shift registers.

Figure 7C:
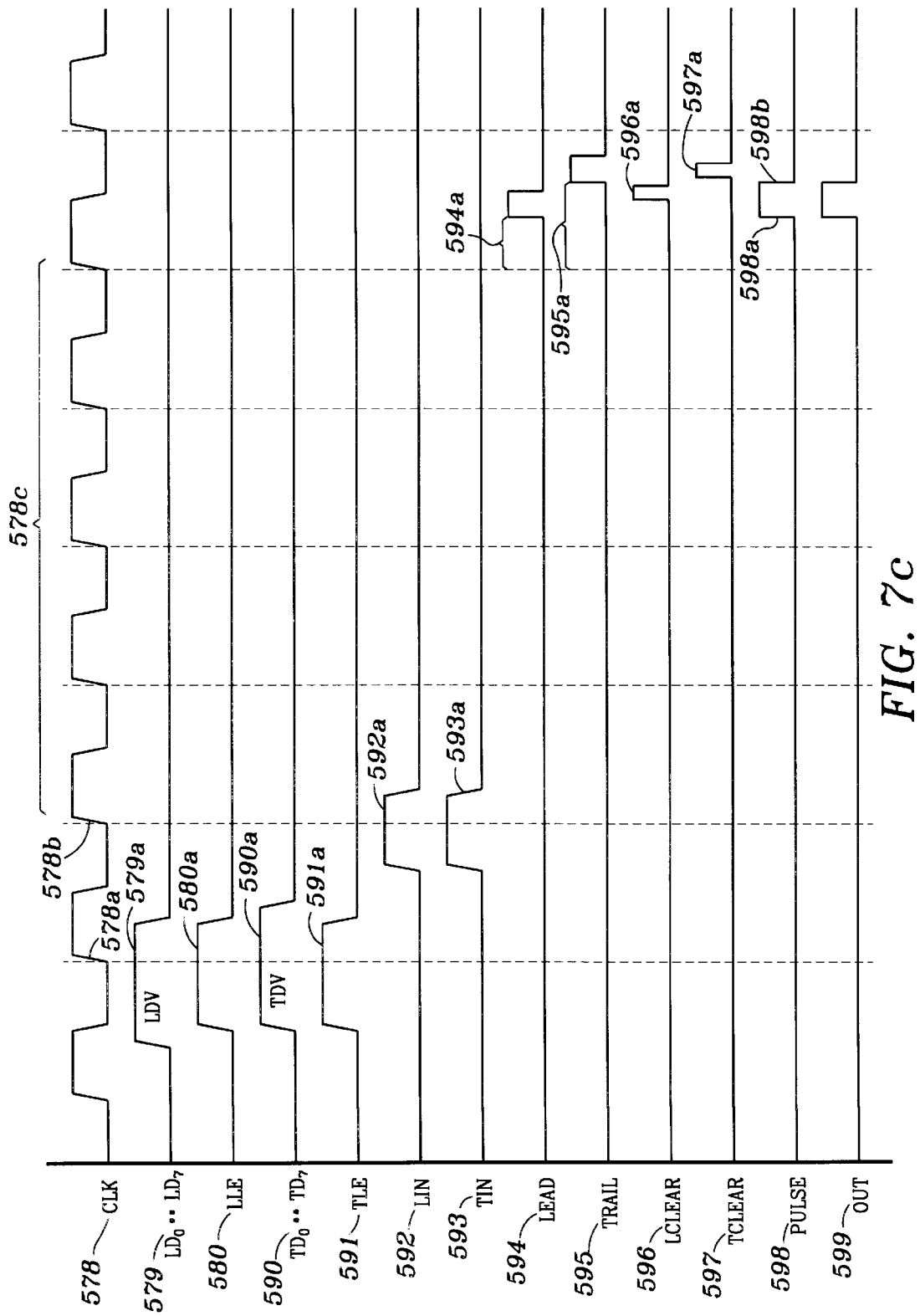
FIG. 7c is a timing diagram of the operation of the pulse generator of FIG. 7a in pulse generation mode.

Referring to FIGS. 7a and 7c, the system clock CLK on line 520 of FIG. 7a provides the basis for all signal sampling. A desired 8-bit leading (delay value LDV at 579a of waveform 579 of FIG. 7c is placed on bus 521 of FIG. 7a, and a leading edge latch enable LLE on line 522a is asserted at 580a of waveform 580, and sampled by the rising edge of the system CLK signal of waveform 578 at 578a. Concurrently, a desired 8-bit trailing edge delay value TDV at 590a of waveform 590 is placed on bus 527 of FIG. 7a, and a trailing edge latch enable signal TLE of waveform 591 is asserted at 591a. Both signals are sampled at the rising edge 578a of the system CLK of waveform 578 when the programmed delay value latency is non-zero, as determined by configuration register 500, bits C4–C6. Thus, both leading- and trailing-edge delay values have been loaded simultaneously into leading delay cell 501 and trailing delay cell 502 of FIG. 7a, respectively.

Once delay values have been loaded into a delay cell, triggering may then occur. Leading edge trigger LIN of waveform 592 is asserted at 592a, and trailing edge trigger TIN of waveform 593 is simultaneously asserted at 593a. Both signals are sampled at 578b of waveform 578 when the programmed trigger latency is non-zero as determined by configuration register 500, bit C0. For a programmed latency of three clock periods by way of example, four clock periods as indicated at 578c of waveform 578 elapse.

Following the expiration of the programmed latency period, both the leading and trailing edge asynchronous delays commence. A leading edge programmed signal propagation delay, LEAD signal of waveform 594, is asserted at 594a, and thereby causes the PULSE signal of waveform 598 to be asserted at 598a. In response, the LCLEAR signal of waveform 596 is asserted at 596a until the LEAD signal of waveform 594 is reset. After a trailing edge programmed signal propagation delay at 595a of waveform 595 is asserted, the PULSE signal of waveform 598 is cleared at 598b, thereby causing the TCLEAR signal of waveform 597 to be asserted at 597a until the signal TRAIL of waveform 595 is reset. Buffered signal OUT of waveform 599 follows the signal PULSE. Thus, the width of the pulse of the signal OUT of waveform 599 is equal to the difference between the total of the programmed latency period and the programmed propagation delays of the asynchronous leading edge, and the sum of the trailing edge delays.

Figure 7D:
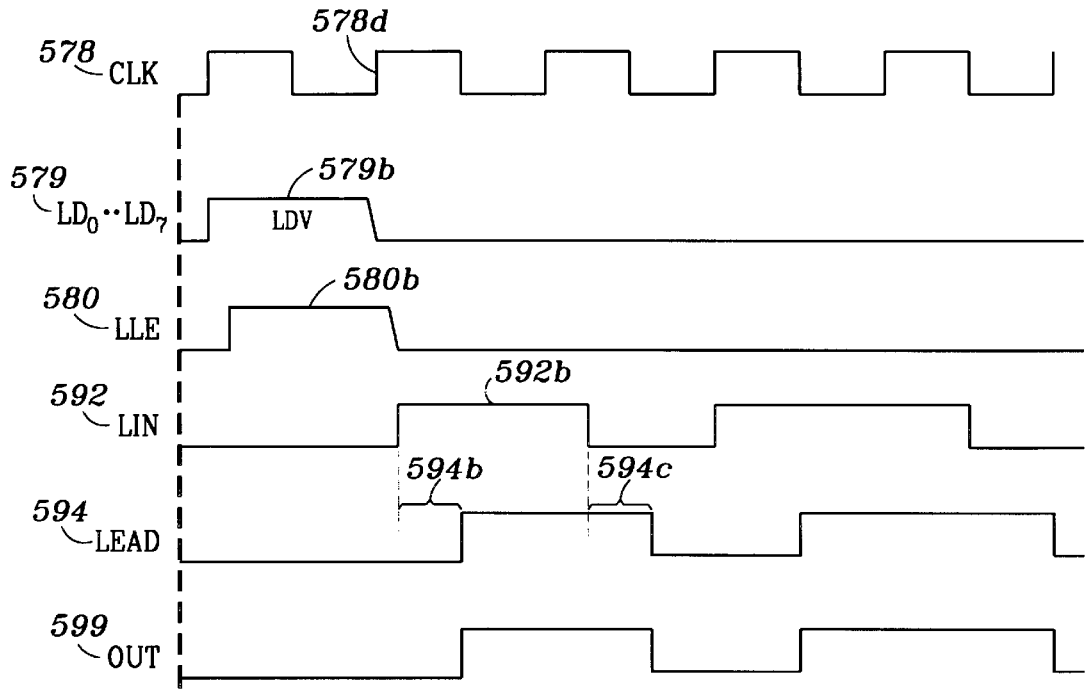
FIG. 7d is a timing diagram of the operation of the pulse generator of FIG. 7a in a flow-through mode.

Referring to FIGS. 7a and 7d, the operation of the pulse generator 500 of FIG. 7a in "flow-through" mode is shown by way of a timing diagram. Flow-through mode is characterized by operating leading delay cell 501 and trailing delay cell 502 independently; by having a trigger latency of zero clocks; and by an output following an input by a programmable propagation delay. Flow-through mode is useful for providing a simple programmable delay to a repetitive signal such as a data sampling clock, or a reference clock for a unit under test.

The following discussion is given using references only to the leading delay cell 501, but the functional descriptions apply equally well to the trailing, delay cell 502.

After a desired delay value LDV at 579b of waveform 579 of FIG. 7d is applied by the system processor to the leading delay value bus 521 of FIG. 7a, the leading edge latch enable LLE of waveform 580 is asserted at 580b. The LLE signal is sampled at the rising edge of the system CLK signal of waveform 578 at 578d when delay value latency is non-zero as determined by configuration register 500, bits C4–C6. Upon the configuration register 500's bit C0 output being reset to a logic 0, the trigger latency pipeline of pipe line register 82 of FIG. 3 is disabled, thereby making the processing of the signal LIN of waveform 592 of FIG. 7d completely asynchronous to the system clock CLK. If desired, the delay value pipeline of pipeline register 81 of FIG. 3 also may be used in flow-through mode. As an example, the LIN signal of waveform 592 may be applied to the leading delay cell 501. The Output LEAD of waveform 594 will follow both the rising and the falling edges of the LIN signal by same programmed propagation delays 594b and 594c. The buffered output signal OUT of waveform 599 follows the LEAD signal after a delay of approximately one nanosecond. Thus, the leading trigger LIN is output by the leading delay cell 501 as the LEAD signal after a propagation delay, and the LEAD signal is supplied at the output of multiplexer 505 of FIG. 7a at the signal OUT of waveform 599 of FIG. 7d.

Figure 8:
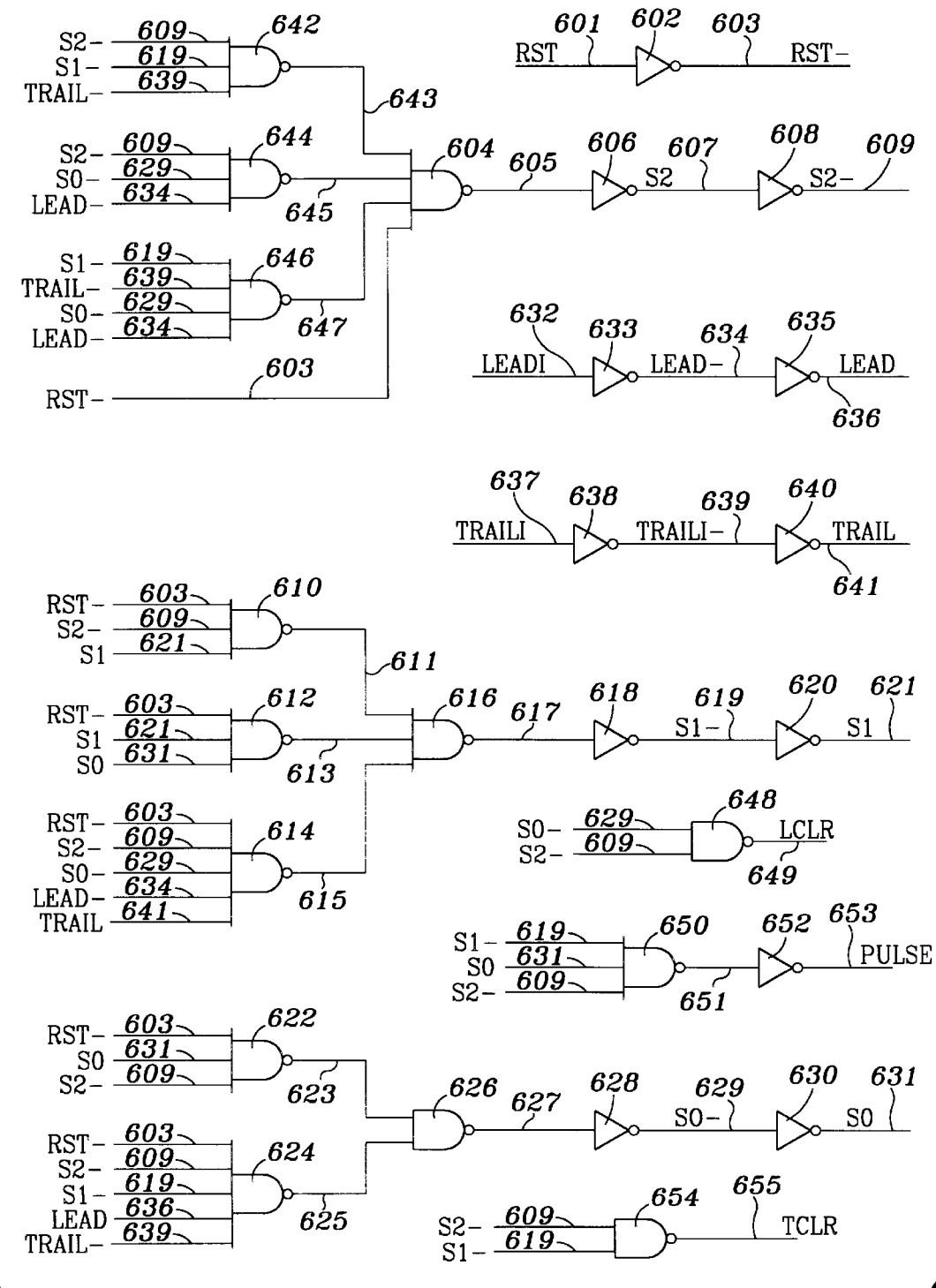

Referring to FIG. 8, the pulse generator (PG) asynchronous state machine 600 employs an asynchronous design, rather than the more conventional synchronous design, to accommodate the inherently asynchronous arrivals of leading and trailing edge signals. Further, a state machine is preferred over simply setting a flip-flop with the leading edge, and resetting with the trailing edge, to ensure that no false output pulses are produced in the event that the trailing edge precedes the leading edge. Operation of the PG asynchronous state machine 600 complies with a mandatory requirement of asynchronous state machines. That is, only one bit changes when transitioning from one state to the next. In the event that an unused state is ever entered, a defined sequence of state transitions occurs to return to the quiescent condition state 000.

Returning to FIG. 8, a reset signal is provided by the system processor on a line 601, and is applied through an inverter 602 to a line 603 leading; to one input of a NAND gate 604, to one input of a NAND gate 610, to one input of a NAND gate 612, to one input of a NAND gate 614, to one input of a NAND gate 614, to one input of a NAND gate 622, and to one input of a NAND gate 624. The output of NAND gate 604 is applied by way of a line 605 to the input of an inverter 606. The output of inverter 606 is applied along a line 607 and through an inverter 608 to a line 609. The line 609 in turn is electrically connected to one input of a NAND gate 642, to one input of a NAND gate 644, to a second input of NAND gate 610, to a second input of NAND gate 614, to a third input of NAND gate 622, to a second input of NAND gate 624, to one input of NAND gate 648, to one input of NAND gate 650, and to one input of NAND gate 654.

The output of gate 610 is applied along a line 611 to one input of a NAND gate 616, a second input of which is electrically connected by way of a line 613 to the output of NAND gate 612. A third input to gate 616 is electrically connected by way of a line 615 to the output of gate 614. The output of gate 616 is applied along a line 617, and through an inverter 618 to a line 619 leading to the input of an inverter 620. Line 619 also leads to a second input of NAND gate 642, to one input of a NAND gate 646, to a third input of NAND gate 624, to a second input of NAND gate 650, and to a second input of NAND gate 654. The output of inverter 620 is applied to a line 621 leading to a third input of NAND gate 610, and to a second input of NAND gate 612.

The output of NAND gate 622 is applied along a line 623 to one input of a NAND gate 626. Further, the output of NAND gate 624 is applied to a second input of gate 626, and the output of gate 626 is applied along a line 627 to the input of an inverter 628. The output of inverter 628 is applied along a line 629, and through an inverter 630 to a line 631 leading to a third input of NAND gate 612, a second input of NAND gate 622, and to a second input of NAND gate 650. Line 629 also leads to a second input of a NAND gate 644, to a third input of NAND gate 646, to a third input of NAND gate 614, and to a second input of NAND gate 648.

The leading edge signal from multiplexer 505 of FIG. 7a is applied along a line 632 of FIG. 8, and through an inverter 633 to a line 634 leading to the input of an inverter 635. Line 634 also leads to a third input of NAND gate 644, to a third input of NAND gate 646, and to a fourth input of NAND gate 614. The output of inverter 635 is applied to a line 636 leading to a fourth input of a NAND gate 624.

The trailing edge signal from multiplexer 504 of FIG. 7 is applied along a line 637 of FIG. 8, and through an inverter 638 to a line 639 leading to the input of an inverter 640. The line 639 also leads to a third input of NAND gate 642, to a fourth input of NAND gate 646, and to a fifth input of NAND gate 624. The output of inverter 640 is applied to a line 641 leading to a fifth input of NAND gate 614.

The output of NAND gate 648 is a signal LCLR which is issued by the state machine 600 to reset the leading delay cell 501 of FIG. 7, and the output of NAND gate 654 of FIG. 8 is applied to a line 655 to reset the trailing delay cell 502 of FIG. 7.

The output of NAND gate 650 of FIG. 8 is applied by way of a line 651, and through an inverter 652 to a line 653, to supply a PULSE signal to the B inputs of multiplexers 504 and 505 of FIG. 7a.

Figure 9:
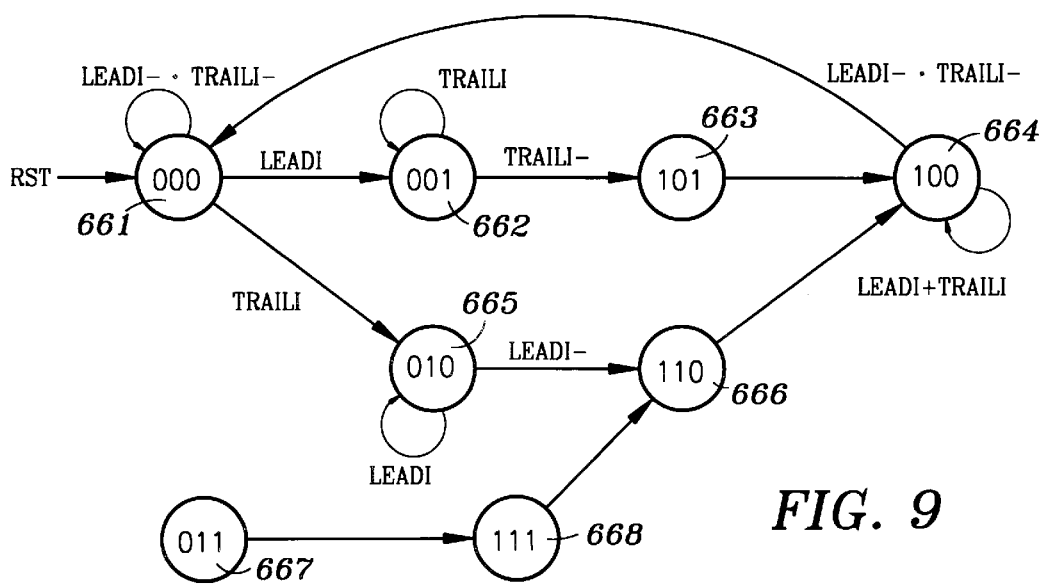
FIG. 9 is a state diagram of the state machine of FIG. 8.
Figure 10:
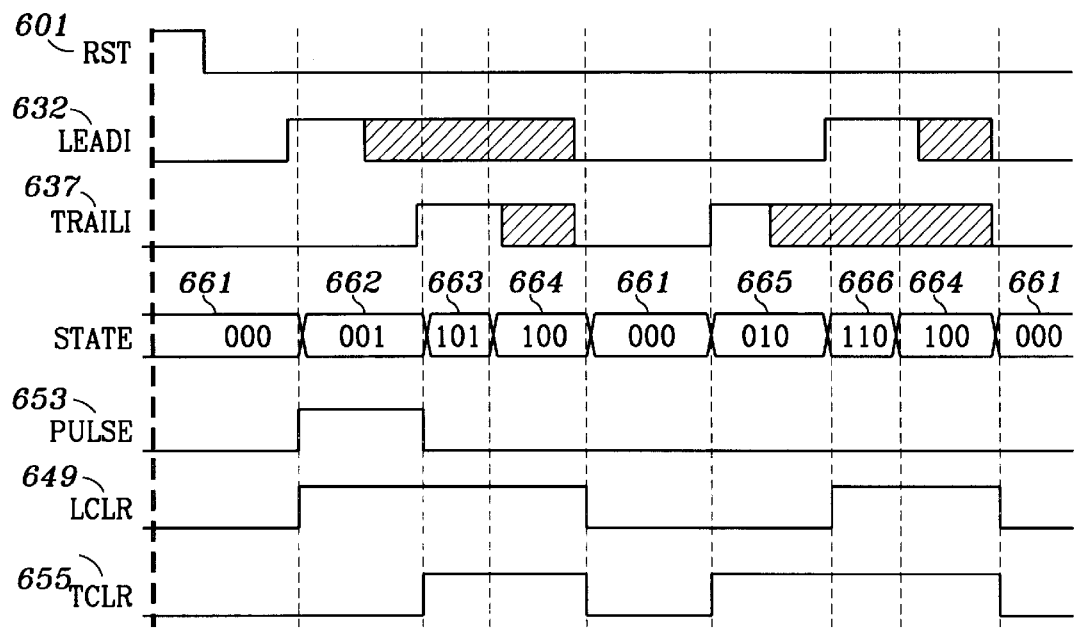
FIG. 10 is a timing diagram of the operation of the state machine of FIG. 8.

Referring to FIGS. 8, 9 and 10, the PG asynchronous state machine 600 of FIG. 8 is initialized to state 000 at 661 of FIGS. 9 and 10 when the RST waveform 670 of FIG. 10 is brought high. Signal 601 is inverted by inverter 602 of FIG. 8 to yield an RST− signal 603, which in turn is applied to one input each of NAND gates 604, 610, 612, 614, 622, and 624, to force the respective lines 605, 611, 613, 615, 623, and 625 high. The high or logic one output of NAND gate 604 on line 605 is inverted by inverter 606 to cause line 607 to go low. The output of inverter 608 thus goes high. The signals on lines 611, 613, and 615 thus are all high as inputs of NAND gate 616, the output of which on line 617 is low. The line 619 thus is high, and the complementary signal on line 621 is low. Signals 623 and 625 are both high as inputs to NAND gate 626 to make the output of gate 626 on line 627 low. The output of inverter 628 thus is high, and the output of inverter 630 is low. The signals S2 on line 607, S1 on line 621, and S0 on line 631 are all low to represent the quiescent state 000 at 661 of FIGS. 9 and 10. That is, the three digits representing a state in which the state machine has entered are identified as S2, S1, S0, with S2 being the most significant.

The following discussion will describe how the PG asynchronous state machine 600 maintains state 000 at 661 of FIG. 9 immediately after the reset condition on line 601 of FIG. 8 and waveform 670 of FIG. 10 is removed. The PG asynchronous state machine 600 receives a LEADI signal on line 632 and a TRAILI signal on line 637. Both signals are in a low state as a result of a system-wide reset condition. When the RESET or RST signal at 601 of FIG. 8 and waveform 670 of FIG. 10 is returned to a low state, inverter 602 produces a high on line 603. With the S2− signal on line 609, the S1− signal on line 619, and the TRAIL− signal on line 639 all high, the output of gate 642 on line 643 is low. The output of gate 604 on line 605 thus is high, after inversion by inverter 606 to keep the S2 signal on line 607 low. The output of inverter 608 thus is high. It may be understood that both NAND gates 644 and 646 have all inputs high, thereby transitioning both lines 645 and 647 low. Any one of inputs 643, 645, and 647 going low is sufficient to maintain the output of gate 604 high on line 605. When the signal S1 on line 621 is low, the output of gate 610 on line 611 goes high. Further, if signal S1 on line 621 or signal S0 on line 631 go low, the output of gate 612 on line 613 is high, and the signal TRAIL on line 641 is low to force line 615 high. With the signals on lines 611, 613, and 615 all high, NAND gate 616 maintains a low on line 617 (as during a reset condition) with the S1 and S2 signals respectively on lines 621 and 607 also remaining in the quiescent condition. When signal S0 on line 631 goes low, the output of gate 622 goes high. Further, when the signal LEAD on line 636 goes low, the output of gate 624 goes high. With the signals on lines 623 and 625 high, gate 626 maintains a low output on line 627 as during the reset condition. Thus, signal S2 on line 607, S1 on line 621, and S0 on line 631 remain low to designate the quiescent state 000 at 661 immediately after a reset condition is removed.

When both the S0– signal on line 629 and the S2– signal on line 606 are high, NAND gate 648 outputs a logic zero to designate the quiescent condition for the LCLR signal of waveform 674 of FIG. 10. When signal S0 on line 631 goes low, NAND gate 650 supplies a logic one output to line 651 to yield a logic zero on line 653 to define the quiescent condition for signal PULSE. With both the S2– signal on line 609 and the S1– signal on line 619 high, the output of NAND gate 654 is low to define the quiescent condition for the signal TCLR 655 of FIG. 8 and waveform 675 of FIG. 10.

In normal operation, the LEADI signal 632 of FIG. 8 and waveform 671 of FIG. 10 goes high to yield a high LEAD signal on line 636 of FIG. 8. With the signals on line 603, 609, 619, and 639 all standing high, the signal LEAD on line 636 going high causes the output of gate 624 to go low on line 625. The output of gate 626 thus goes high to yield a high S0 signal on line 631. With S0 on line 631 high, and both lines 603 and 609 high, the output of gate 622 is low on line 623 to latch the high output of gate 626, whether or not the LEADI signal on line 632 of FIG. 8 remains high. Also, with S0 on line 631 high, and S1– on line 619 and S2– on line 609 already high, gate 650 outputs a logic zero on line 651 to yield a high PULSE signal on line 653. In addition, with S0– on line 629 low, the LCLR signal 649 of FIG. 8 and waveform 674 of FIG. 10 is forced high to reset the leading delay cell 501 of FIG. 7. Thus state 001 at 662 of FIGS. 9 and 10 has been entered, signifying a wait for the arrival of the TRAILI 637.

In state 001 at 662 of FIG. 9, and before the arrival of the TRAILI input, the S2– signal on line 609, the S1– signal on line 619, and the TRAIL– signal of FIG. 8 on line 639 are all high. Gate 642 thus outputs a logic zero on line 643. The signal S0– on line 629 is low, forcing the gate 644 to output a high on line 645. The signal RST– on line 603 is high, and the S0– signal on line 629 is low, thereby forcing gate 646 to output a high on line 647. At the time of completion of a desired PULSE at 653 of FIG. 10, TRAILI at 637 of FIG. 8 and waveform 672 of FIG. 10 goes high. The signal TRAIL on line 641 of FIG. 8 thus is high. If TRAIL– on line 639 goes low, the output of gate 642 goes high on line 643. All inputs to gate 604 thus are high, thereby causing the output of gate 604 to be low, and yielding a low on line 609 which is applied to the inputs of both gates 648 and 654 to make the signals LCLR on line 649 and TCLR on line 655 high. Both the leading delay cell 501 and the trailing delay cell 502 of FIG. 7a are thereby reset. Signals S0 on line 631 and S1 on line 621 are unchanged. Thus state 101 at 663 of FIGS. 9 and 10 is entered, and the signal PULSE at 653 of FIG. 8 and waveform 673 of FIG. 10 return to a low state.

In state 101, the signal S2– on line 609 has gone low at the inputs of gates 622, 624 and 648. The outputs of the gates on lines 623, 625 and 649 thus are high. Gate 626 thus outputs a low on line 627 to yield a low S0 signal on line 631. Thus, state 100 is entered at 664 of FIGS. 9 and 10 to signify a wait for both the LEADI signal on line 623, and the TRAILI signal on line 637 of FIG. 8 to return to their quiescent state. It should be noted that the state 101 at 663 of FIGS. 9 and 10 persists only briefly (the propagation time of only five logic elements between the S2 signal on line 607 going high and the S0 signal on line 631 going low) before state 100 at 664 of FIGS. 9 and 10 is entered.

In state 100, the signals S1– on line 619 and S0– on line 629 of FIG. 8 are both high. When both the LEADI and TRAILI signals return to their quiescent states, the corresponding signals LEAD– on line 634 and TRAIL– on line 639 are high. All inputs to gate 646 thus are high, and the output of the gate on line 647 is low. The output of gate 604 thus goes high to yield a low S2 signal on line 607, and a high S2– signal on line 609. The LCLR signal at the output of gate 648 thus returns to a low state. The PG asynchronous state machine 600 thereby returns to state 000 at 661 of FIGS. 9 and 10 to await the next input.

In state 000 at 661 of FIGS. 9 and 10, and in the event that the TRAILI signal on line 637 of FIG. 8 goes high before the LEADI signal on line 632 goes high, the signals on lines 603, 609, 629, and 634 are high, and the TRAIL signal on line 641 goes high. All inputs to gate 614 thus are high, and the gate output on line 615 is low. The S1 signal on line 621 thus is high.

A low S1– signal on line 619 is input to gate 654 to force a high TLCR signal on line 655. The trailing delay cell 502 of FIG. 7 is thus reset, and state 010 at 665 of FIGS. 9 and 10 is entered to wait for the LEADI signal on line 632 to go high. Only state 001 at 662 of FIGS. 9 and 10 produces the PULSE signal output on line 653. Therefore, there is no false output from the PG state machine 600 in the event that the TRAILI signal precedes the LEADI signal in time.

In state 010, the S2– signal on line 609 and the S0– signal on line 629 are both high at the inputs of gate 644. With the LEAD– signal on line 634 high, the output of gate 644 on line 645 is low. All remaining inputs to gate 604 are high. The output of gate 604 is a low. When the LEADI signal on line 632 goes high, the signal LEAD– on line 634 goes low. The output of gate 644 then goes high to make all inputs to gate 604 high. The output of gate 604 on line 605 thus goes low to yield a high S2 signal on line 607. Thus, state 110 at 666 of FIGS. 9 and 10 is entered.

Immediately upon entering state 110 at 666 of FIGS. 9 and 10, the RST– signal on line 603 and the S1 signal on line 621 are high at the inputs of gate 610. With the S2– signal on line 609 high, the output of gate 610 is low. All remaining inputs to gate 616 also are high, and the output of gate 611 on line 617 is low. The transition of the S2– signal on line 609 to a low at the input of gate 610 forces the output of the gate to go high on line 611. Gate 616 thus outputs a low on line 617 to yield a low S1 signal on line 621. State 100 at 664 of FIGS. 9 and 10 is entered to wait for both the LEADI signal on line 632 and the TRAILI signal on line 637 to return to their quiescent states. State 110 at 666 of FIGS. 9 and 10 persists only briefly (the propagation time of only five logic elements between the S2 signal on line 607 going high and the S1 signal on line 621 going low) before state 100 at 664 of FIGS. 9 and 10 is entered. From state 100 at 664, the PG asynchronous state machine 600 proceeds to state 000 at 661 as previously described.

In the event that an erroneous state 011 at 667 of FIG. 9 is entered, the S1− signal on line 619 goes low at the inputs of gates 642 and 646 of FIG. 8, and the outputs of both gates go high. When the S0− signal on line 629 goes low at the inputs of gates 644 and 646, the outputs of the gates go high. With the RST− signal on line 603 high, all inputs to gate 604 are high, and the output of gate 604 on line 605 goes low to yield a high S2 signal on line 607. With signal S2− on line 609 low, the outputs of gates 648 and 654 (LCLR on line 649 and TCLR on line 655) are high. Both the leading delay cell 501 and the trailing delay cell 502 of FIG. 7 thereby are reset. Thus, the PG asynchronous state machine 600 has entered state 111 at 668 of FIGS. 9 and 10.

Upon entering state 111, the S2− signal on line 609 of FIG. 8 is low, and is applied to the inputs of both gates 622 and 625. The outputs of gate 622 and 625 thus go high, and the output of gate 626 goes low to yield a low S0 signal on line 631. Thus, state 110 at 666 of FIGS. 9 and 10 is entered. State 111 at 668 of FIGS. 9 and 10 persists only briefly (the propagation time of only five logic elements between the S2 signal on line 607 going high and the S0 signal on line 631 going low) before state 100 at 664 of FIGS. 9 and 10 is entered. With the S2− signal on line 609 low, gates 648 and 654 respectively output a high LCLR signal on line 649 and a high TCLR signal on line 655, thereby ensuring that both leading delay cell 501 and trailing delay cell 502 of FIG. 7a are reset. From state 100 at 664 of FIGS. 9 and 10, the PG asynchronous state machine 600 proceeds to state 000 at 661 as previously described.

There are two programmable delay cells in each pulse generator. One is a leading delay cell 51 and the other is a trailing delay cell 52 as shown in FIG. 2. The construction of each of the delay cells is identical, and thus only one will be described in more detail. Each of the delay cells is constructed in an increasing building block form beginning with the basic gate delay of one-half nanosecond, and the one nanosecond delay circuit illustrated in FIG. 11. In the circuits which follow, basic AND gates have about a ½ nanosecond delay, while the delay contributed by multiplexers is about one nanosecond. Further, back-to-back inverters impart a propagation delay of about ½ nanosecond.

For repeatability, and assurance that positive going signals are treated in the same manner as negative going signals without degradation, specific logic devices have to be matched to the particular technology being used. In the preferred embodiment, the ASIC technology was 0.8 µCMOS, and the logic devices such as gates and inverters were CMOS.

Figure 11:
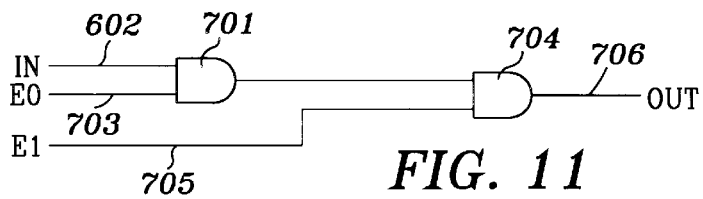
FIG. 11 is a logic diagram of a typical one nanosecond delay circuit used in the invention.

Referring to FIG. 11, a first AND gate 701 has two inputs. One is the signal to be delayed which is received on line 702. The second is a test signal E0 on line 703 which is used to test the integrity of each of the gates comprising the delay chain. The output of gate 701 is applied to one input of an AND gate 704, the other input of which is a test signal E1 which is received on line 705. The output of gate 704 is applied to line 706.

In operation, the test signals E0 and E1 remain at logic 1 states to allow a logic 1 signal on line 702 to pass through the gates 701 and 704. The propagation delay imposed on the logic 1 signal is approximately 500 picoseconds per gate, thus delaying a signal on line 702 by one nanosecond.

When the integrity of the delay line of FIG. 11 is to be tested, the input signal on line 702 may be set to a logic 1, and test signals E0 and E1 may be sequenced so that the E0 signal may be at a logic 0 while the E1 signal is at a logic 1 to sense a logic 0 on line 706. Then the E0 may be set to a logic 1 while the E1 signal is set to a logic 0 state to sense a logic 0 on line 706. Both the E0 and E1 signals may be set to a logic 1 to sense a logic 1 on line 706, and both may be set to a logic 0 to sense a logic 0 on line 706. Similar tests may be conducted with the input signal on line 702 set to a logic 0.

Figure 12:
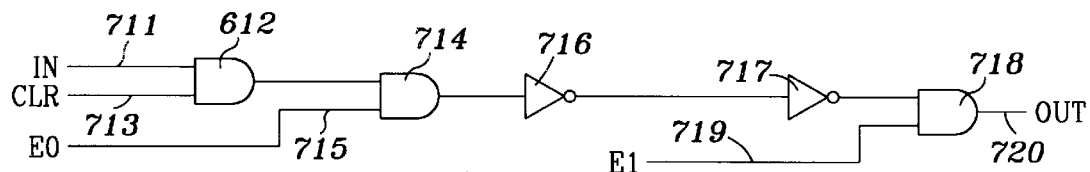
FIG. 12 is a logic diagram of a typical two nanosecond delay circuit used in the invention.

FIG. 12 shows a two nanosecond circuit or building block, where a logic input signal on line 711 is applied to one input of an AND gate 712, the other input of which receives a clear (CLR) signal by way of line 713. The output of gate 712 is applied to one input of an AND gate 714, which also receives the test signal E0 by way of line 715. The output of gate 714 is applied through two inverters 716 and 717 to one input of an AND gate 715. A second input of gate 718 receives the test signal E1 on line 719, and the output of gate 718 is applied to line 720.

As before described, during operation the test signals E0 and E1 are set to a logic 1. In addition the clear (CLR) signal on line 713 is set to a logic 1. Thus, when a logic signal is applied to line 711, it propagates through a one nanosecond delay comprising gates 712 and 714, and a one nanosecond delay comprising inverter 716, inverter 717, and gate 718. Further, when the logic chain is to be cleared, a logic 0 signal is applied to line 713.

When the integrity of the logic elements of the delay chain of FIG. 12 are tested, the line 713 remains at a logic 1 state, the logic states of the E0 and E1 signals on lines 715 and 719 may be varied as before described, and the output of gate 718 may be sensed to determine that the logic devices constituting the logic chain are functioning correctly.

Figure 13:
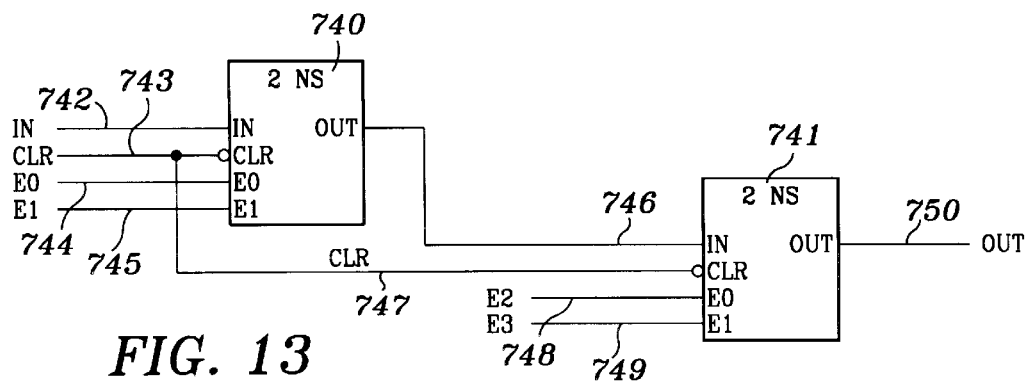
FIG. 13 is a logic diagram of a typical four nanosecond delay circuit used in the invention.

FIG. 13 illustrates the next step in the building block process of configuring a delay chain. Referring to FIG. 13, one two-nanosecond delay device 740 is connected in series to a delay device 741, where each of the delay devices is constructed as shown in FIG. 12. More particularly, delay device 740 receives an input signal on line 742, a CLR signal on line 743, the E0 test signal on line 744, and the E1 test signal on line 745. The output of the delay device 740 is applied by way of line 746 to the input of delay device 741, which receives the CLR signal from line 743 on line 747. The delay device 741 further receives test signals E2 and E3 on lines 748 and 749, respectively, at its E0 and E1 inputs. The output of delay device 741 is applied to line 750.

A four-nanosecond building block has now been developed from two two-nanosecond building blocks.

In operation, The test signals E0, E1, E2, and E3, and the CLR signal are set to a logic 1 state. A logic signal on line 742 thereupon propagates through delay device 740 which imparts a two nanosecond delay, and through delay device 741 which also imparts a two nanosecond delay. Thus, the signal on line 742 incurs a four nanosecond delay before being applied to line 750.

When the delay chain is to be cleared, the logic signal on line 743 is set to a logic zero, which causes both logic device 740 and logic device 741 to be cleared at the same time. This is an improvement over prior art devices which allow a clear state to propagate throughout the entire delay chain, rather than clear each two-nanosecond delay block at the same time.

Testing of the integrity of the delay chain of FIG. 13 occurs as before described, with the CLR signal on lines 743 and 747 set to a logic 1, and the test signals E0, E1, E2, and E3 respectively on lines 744, 745, 748, and 749 being sequenced between logic states 0 and 1.

Continuing with this building block process, it may readily be seen that two four-nanosecond delay devices, with each having four test signal inputs, may be electrically connected to provide an eight-nanosecond delay device, and that two eight-nanosecond delay devices with each having eight test signal inputs may be electrically connected to provide a sixteen-nanosecond delay device. Lastly, two sixteen-nanosecond delay devices may be electrically connected in the same manner with each having sixteen test signal inputs to provide a thirty-two nanosecond delay device.

Figure 14A:
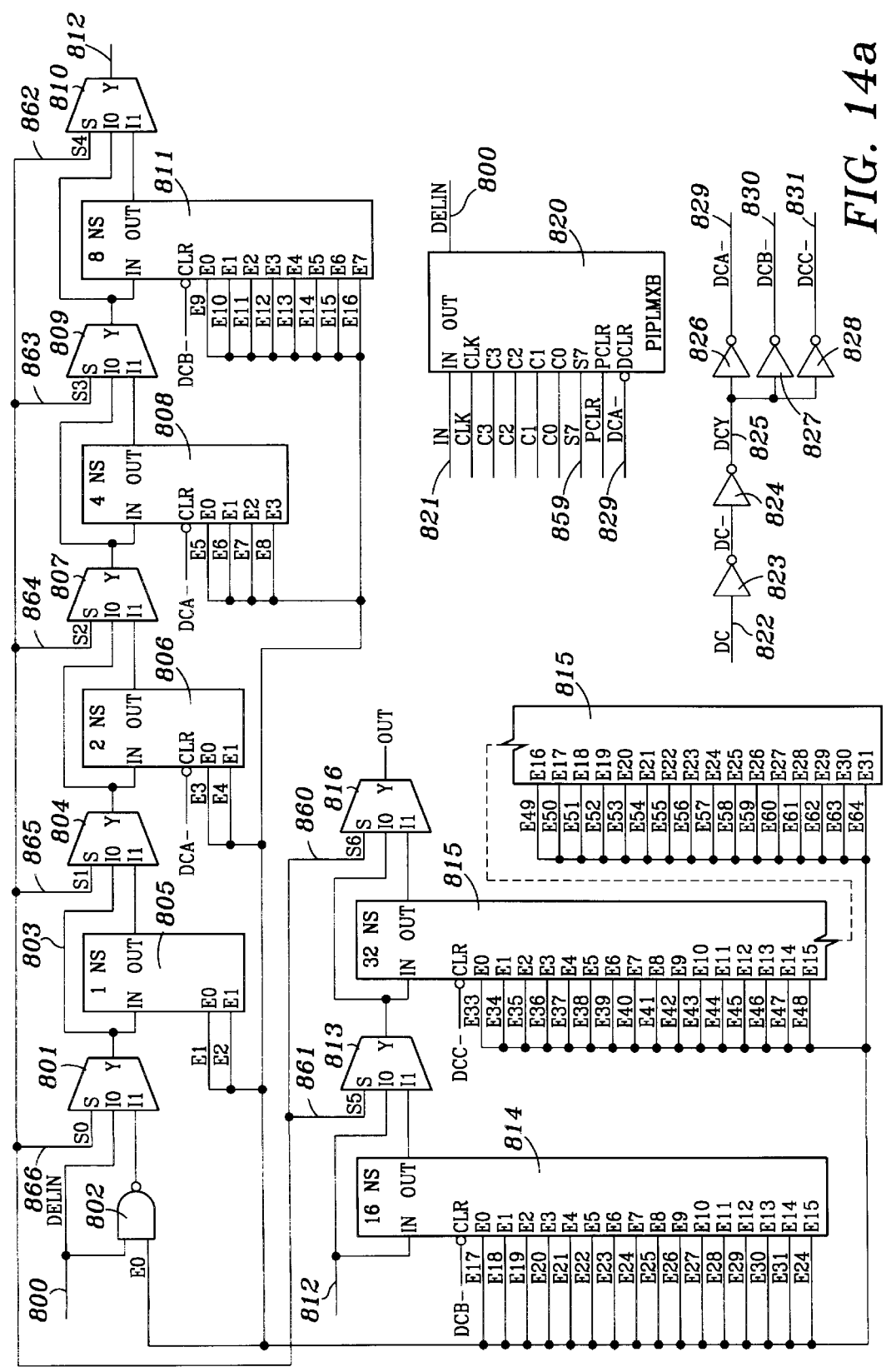
Figure 14B:
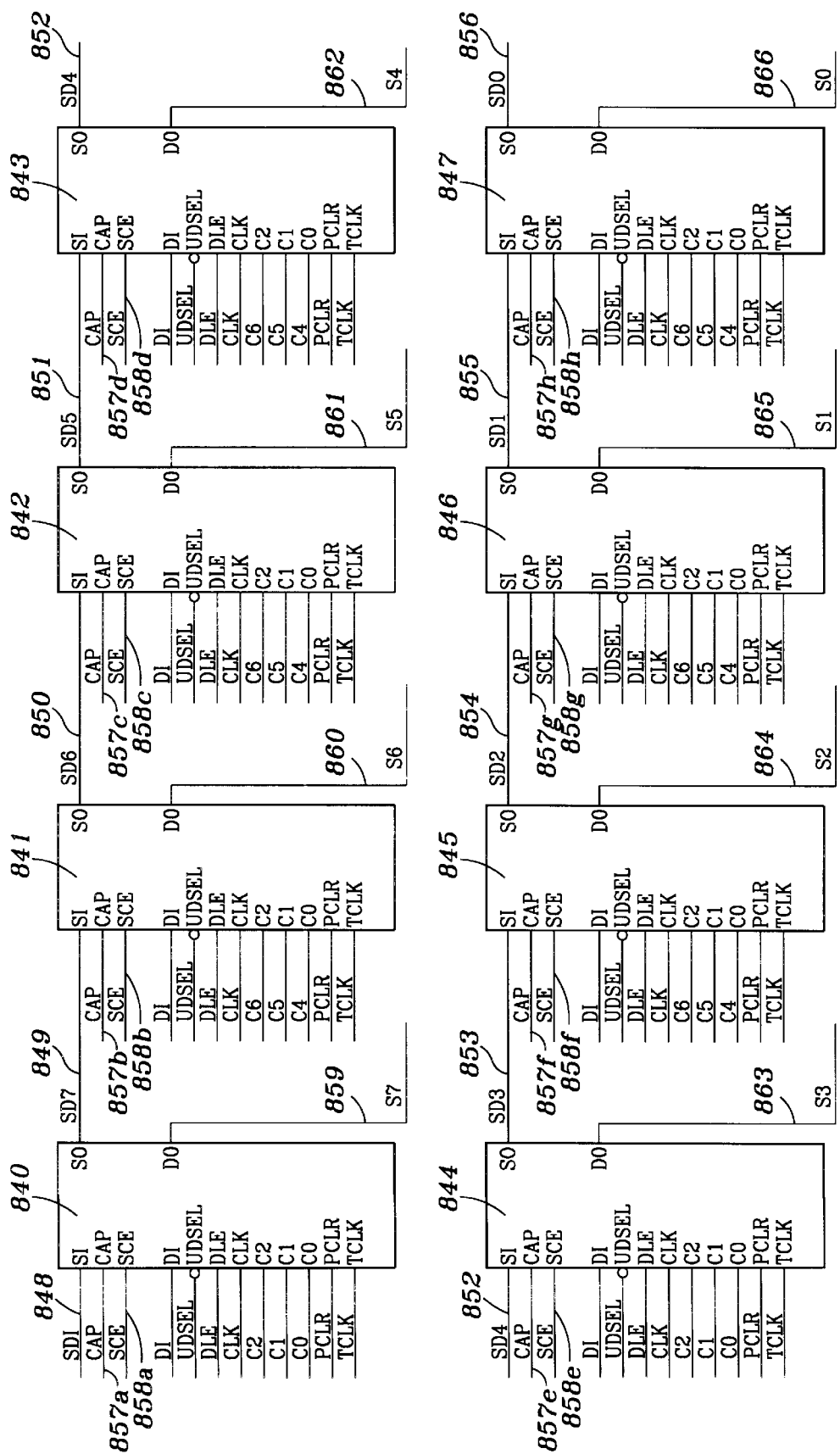

With the above building block process of developing a delay chain in mind, reference may be made to FIGS. 14a and 14b which illustrate one of leading delay cell 501 and trailing delay cell 502 of FIG. 7a. Referring to FIG. 14a, a delay cell is shown in electrical schematic form with an input signal on a line 800 leading to one input of a multiplexer 801 and to one input of an AND gate 802. The output of the AND gate 802 is applied to a second input of multiplexer 801, the output of which is applied by way of a line 803 to one input of a multiplexer 804 and to the input of a one nanosecond delay device 805. The output of the delay device 805 is applied to a second input of multiplexer 804. The output of multiplexer 804 in turn is applied to the IN input of a two nanosecond delay device 806, and to an data input of a multiplexer 807. The output of multiplexer 804 is applied to the second data input of multiplexer 807.

The output of multiplexer 807 is electrically connected to the IN input of a delay device 808, and to one data input of a multiplexer 809. The other data input to multiplexer 809 is electrically connected to the output of delay device 808, and the output of multiplexer 809 is applied to one data input of a multiplexer 810 and to the IN input of a delay device 811. The output of delay device 811 is applied to a second data input of multiplexer 810.

The output of multiplexer 810 is applied along a line 812 to one data input of a multiplexer 813, and to the IN input of a 16 nanosecond delay device 814. The output of delay device 814 is applied to a second data input of multiplexer 813, the output of which is applied to the IN input of a thirty-two nanosecond delay device 815 and to one data input of a multiplexer 816. The second data input of multiplexer 816 is electrically connected to the output of delay device 815. The output of multiplexer 816 is the input signal on line 800 delayed by the cumulative delay imparted by selected ones of AND gate 802 and delay devices 805, 806, 808, 811, 814, and 815.

The signals E0–E64 are test enable signals originating in the JTAG interface 11 of FIG. 1 and distributed in parallel to asynchronous portions of all of the delay lines. All of the signals E0–E64 are held to a logic one level during normal operation of the system of FIG. 1. Returning to FIG. 14a, the E0 test signal is applied to one input of AND gate 802, and the E1 and E2 test signals are applied to the E0 and E1 inputs, respectively, of delay device 805. The E3 and E4 test signals are applied to the E0 and E1 inputs, respectively, of delay device 806, and the E5–E8 test signals are respectively applied to the E0–E3 inputs of delay device 808.

In like manner, the E9–E16 test signals are applied respectively to the E0–E7 inputs of delay device 811, and the E17–E32 test signals are applied respectively to the E0–E15 inputs of delay device 814. Lastly, the E33–E64 test signals are respectively applied to the E0–E31 inputs of delay device 815.

As before described in connection with the description of FIG. 7a, the configuration signals C0–C7 are supplied by the configuration register 500. Configuration signals C0–C3 are applied respectively to the C0–C3 inputs of a pipeline multiplexer 820 of FIG. 14a. An input signal which is to be delayed by the delay cell is received it its IN input by the pipeline multiplexer 820, which also receives a pipeline clear (PCLR) signal from the system processor at its PCLR input. The asynchronous state machine 503 of FIG. 7a issues a delay clear (DC) signal on line 822 of FIG. 14a which is applied through inverters 823 and 824 to a line 825 leading to the inputs of inverters 826, 827, and 828. The output of inverter 826 is applied by way of line 829 to the inverted clear inputs of delay devices 806 and 808, and to the inverted DCLR input of pipeline multiplexer 820. The output of inverter 327 is applied by way of line 830 to the inverted clear inputs of delay devices 811 and 814, and the output of inverter 828 is applied by way of a line 831 to the inverted clear input of delay device 815.

The generation of the delay select signals S0–S7 occurs in the electronic circuit illustrated in FIG. 14b, which is comprised of pipeline multiplexers 840, 841, 842, 843, 844, 845, 846, and 847. A JTAG serial data input signal (SDI) on a line 848 is applied to the SI input of multiplexer 840 to provide an SD7 JTAG signal at its SO output on a line 849. The SD7 signal in turn is applied to the SI input of multiplexer 841 to provide an SD6 JTAG signal at its SO output on a line 850, and the signal generation continues in like manner through pipeline multiplexers 842, 843, 844, 845, 846, and 847 to produce the signals SD5 on line 851, SD4 on line 852, SD3 on line 853, SD2 on line 854, SD1 on line 855, and SD0 on line 856. The CAP signal on line 551 of FIG. 7a is applied to lines 857a–857h leading to the CAP input of each of the multiplexers 840–847, respectively. Further, the system processor via the JTAG interface 11 of FIG. 1 applies a shift register enable signal (SCE) to lines 858a–858h of FIG. 14b leading to the SCE inputs of each of the multiplexers. The delay value signals D0–D7 are applied in parallel respectively to the DI inputs of the multiplexers 847–840.

The inversion of the signal UDSEL on line 518 of FIG. 7a is applied to the inverted UDSEL– inputs of each of the multiplexers 840–847, and the system processor applies a delay value enable signal to the DLE inputs of each of the multiplexers to control the loading of the D0–D7 delay value signals. Further, the system clock signal on line 520 of FIG. 7a is applied to the CLK inputs of each of the multiplexers 840–847. The configuration signals C4–C6 are applied respectively to the C0–C2 inputs of each of the multiplexers 840–847. Lastly, the pipeline clear (PCLR) signal from the system processor, and the JTAG clock signal (TCLK) are applied respectively to the PCLR and TCLK inputs of each of the multiplexers 840–847. The D0 outputs of multiplexers 840–847 are electrically connected to lines 859–866 to respectively provide the delay selects S7–S0.

Returning to FIG. 14a, the S7 delay select signal on line 859 is applied to the S7 input of multiplexer 820, and the S6 delay value signal on line 860 is applied to the S input of multiplexer 816. Further, the S5 delay value signal on line 861 is applied to the S input of multiplexer 813, and the S4 delay value signal on line 862 is applied to the S input of multiplexer 810. In addition, the S3 delay value signal on line 863 is applied to the S input of multiplexer 809, the S2 delay value signal on line 864 is applied to the S input of multiplexer 807, the S1 delay value signal on line 865 is applied to the S input of multiplexer 804, and the S0 delay value signal on line 866 is applied to the S input of multiplexer 801.

In operation, the E0–E64 signals applied to the inputs of delay devices 805, 806, 808, 811, 814, and 815 are set to a logic one level by the JTAG interface 11 of FIG. 1, and output bits C4, C5, and C6 of configuration register 500 of FIG. 7a are applied to the C0, C1, and C2 inputs respectively of the pipeline multiplexers 840, 841, 842, 843, 844, 845, 846, and 847 of FIG. 14b. In addition, the C0, C1, C2, C3 bit outputs of configuration register 500 of FIG. 7a are applied respectively to the C0–C3 inputs of multiplexer 820 of FIG. 14a. The multiplexer 820 imparts the latency previously described in connection with pipeline register 82 of FIG. 3, and the pipeline multiplexers 840–847 perform the functions of the previously described pipeline register 81 of FIG. 3. Referring to FIG. 14b, delay values as represented by D7–D0 are respectively applied to the DI inputs of pipeline multiplexers 840–847.

If latency is to be applied to an input trigger from the system processor as indicated by the signal on line 821 of FIG. 14a, bit C0 from configuration register 500 is non-zero. Bits C3, C2, C1 contain a three-bit binary code ranging from 000 signifying a latency of one system clock, 001 signifying a latency of two system clocks, and so forth through 111 signifying a latency of eight system clocks. Bits C3,C2,C1, C0 are applied to the input of pipeline multiplexer 820 of FIG. 14a. Multiplexer 820 thereupon applies a delay to the signal on line 821 as determined by the four-bit configuration code of the C0–C3 input signals, and applies the delayed processor trigger signal by way of line 800 to the programmable delay chain comprised of gate 802, and delay devices 805, 806, 808, 811, 814, and 815. Thereafter, the delay imparted to the processor trigger signal is further refined by the delay chain represented by AND gate 802 and the delay devices 805, 806, 808, 811, 814, and 815, in response to the delay value signals (S0–S6) supplied by the multiplexers of FIG. 14b. More particularly, upon the system processor issuing a delay latch enable signal to the DLE inputs of the multiplexers 840–847, the delay values represented by D7–D0 are respectively loaded into the multiplexers 840–847. The bits D0–D7 thereupon are individually delayed a period of time designated by the three bit code of configuration bits at the C0–C2 inputs of the individual multiplexers, before being output respectively as delay value signals S0–S7 on lines 866–859. The S0–S7 signals thereby are timed in numbers of system clocks to control the operation of multiplexers 801, 804, 807, 809, 810, 813, and 816, and to selectively impart the delay provided by delay devices 805, 806, 808, 811, 814, and 815 as before described.

If the delay value signal S0 on line 866 is low, the processor trigger on line 800 is passed through multiplexer 801 without incurring the gate delay which would be imparted by AND gate 802. If S0 is high, however, a delay of 500 to 550 picoseconds is imparted by gate 802 before the processor trigger signal is applied to inputs of delay device 805 and multiplexer 804. If the signal S1 on line 865 is low, the processor trigger at the output of multiplexer 801 is applied through the multiplexer 804 without incurring the delay of one nanosecond that would be imparted by delay device 805. If the signal S1 is at a logic one, however, the multiplexer 804 switches to the output of delay device 805 as its input, and the processor trigger signal undergoes a one nanosecond delay before being applied by the multiplexer 804 to inputs of multiplexer 807 and delay device 807. In this manner, the processor trigger signal on line 800 may selectively undergo consecutive delays of 500 to 550 picoseconds by gate 802, one nanosecond by delay device 805, two nanoseconds by delay device 806, four nanoseconds by delay device 808, eight nanoseconds by delay device 811, sixteen nanoseconds by delay device 814, and thirty-two nanoseconds by delay device 815 before being output by the multiplexer 816. Thus, a delay range of 0–63.5 nanoseconds may be selectively applied in delay increments of 0.5 nanoseconds as provided by the delay devices of FIG. 14a.

One of the innovations of the present invention is the ability to clear both the asynchronous sections of the programmable delay system, and the final stages of the synchronous pipeline portions of the system at the same time. Hence, the signal DC on line 822 of FIG. 14a is translated to the DCA–, DCB–, and DCC– signals respectively on lines 829–831, which are used to clear delay devices 806, 808, 811, 814, and 815, and multiplexer 820. Further, the system processor may issue a clear signal to the PCLR inputs of multiplexers 840–847 of FIG. 14b to completely reset the pipeline registers and JTAG shift registers.

The SCE signal on lines 858a–858h is issued by the system processor the JTAG interface 11 of FIG. 1 to shift data through the configuration register 500 of FIG. 7a, and to shift serial data through the multiplexers 840–847 of FIG. 14b. The system processor also uses the CAP inputs of the multiplexers 840–847 of FIG. 14b to capture the contents of the configuration register 500 for JTAG testing purposes, and the inverted UDSEL– inputs of the multiplexers to update the pipeline register with the JTAG serial data on lines 848–856 for JTAG testing purposes.

Figure 15:
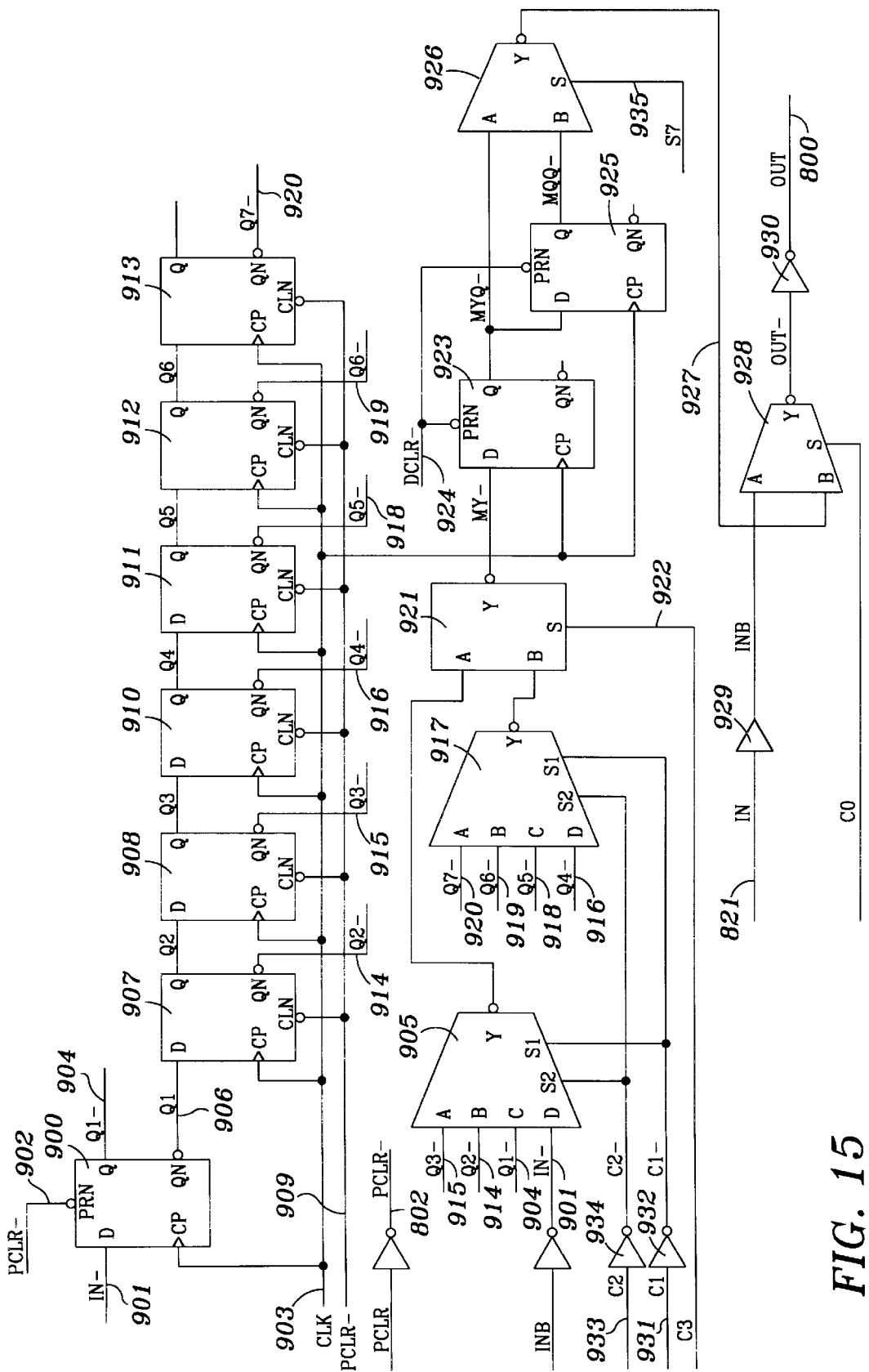

The multiplexer 820 of FIG. 14a is shown in more detail in FIG. 15, where a flip-flop 900 receives an inverted system processor trigger signal in a line 901 at its D input, a pipeline clear signal PCLR on a line 902 at its inverted PRN input, and the system clock signal on a line 903 at its CP input. The Q output of flip-flop 900 is applied by way of a line 904 to the C input of a multiplexer 905. The inverted QN output of flip-flop 900 is applied to a line 906 leading to the D input of a flip-flop 907, the Q output of which is electrically connected to the D input of a flip-flop 908. The clock or CP input of flip-flop 908 is electrically connected to line 903, and the clear or CLN input is connected by way of an inverter to a line on which the system microprocessor applies the clear signal PCLR. The line 909 also is electrically connected to the inverted clear (CLN) inputs of flip-flops 910, 911, 912, and 913. In addition, line 903 is electrically connected to the clock inputs of flip-flops 910, 911, 912, and 913.

The Q output of flip-flop 907 is applied to the D input of flip-flop 908, and the inverted QN output of flip-flop 907 is applied by way of a line 914 to the B input of multiplexer 905. The Q output of flip-flop 908 in turn is applied to the D input of flip-flop 910, and the inverted QN output of flip-flop 908 is applied by way of a line 915 to the A input of multiplexer 905. The Q output of flip-flop 910 is applied to the D input of flip-flop 911, and the inverted QN output of the flip-flop 910 is applied by way of a line 916 to the D input of a multiplexer 917.

Continuing, the Q output of flip-flop 911 is applied to the D input of flip-flop 912, and the inverted QN output of the flip-flop 911 is applied by way of a line 918 to the C input of multiplexer 917. The Q output of flip-flop 912 is applied to the D input of flip-flop 913, and the inverted QN output of flip-flop 912 is applied by way of a line 919 to the B input of multiplexer 917. The inverted QN output of flip-flop 913 is applied by way of a line 920 to the A input of multiplexer 917.

The inverted output of multiplexer 917 is applied to the B input of a multiplexer 921, the A input of which is connected to the inverted output of multiplexer 905. The selector input (S) of multiplexer is electrically connected to a line 922 leading to the C3 output of configuration register 500 of FIG. 7a. The inverted output of multiplexer 921 of FIG. 15 is applied to the D input of a flip-flop 923, the clock or CP input of which is electrically connected to line 903. The inverted clear or PRN input of flip-flop 923 is electrically connected to a line 924 to which is applied a clear signal DCLR derived from the delay clear signal (DC) on line 822 of FIG. 14a. Line 924 also is electrically connected to the inverted clear or PRN input of a flip-flop 923, the D input of which is electrically connected to the Q output of flip-flop 923 and the A input of a multiplexer 926. The clock or CP input to flip-flop 923 is electrically connected to the CP input of flip-flop 925. The Q output of flip-flop 925 is applied to the B input of multiplexer 926, the inverted output of which is applied by way of a line 927 to the B input of a multiplexer 928. The system processor trigger signal (IN), which is the inverse of the signal on line 901, is applied by way of an inverter 929 to the A input of multiplexer 928. The inverted output of multiplexer 928 is applied by way of an inverter 930 to the output line 800 of FIG. 14a.

The operation of flip-flops 900, 907, 908, 910, 911, 912, 913, 923, and 925 is synchronous with the system clock on line 903. The operation of the multiplexers 905, 917, 921, and 928 are controlled by the configuration register 500 of FIG. 7a. More particularly, the C0 output of the configuration register is applied to the selector (S) input of multiplexer 928, and the C3 output of the configuration register is applied to the S input of multiplexer 921. The C1 output of the configuration register 500 on a line 931 is applied through an inverter 932 to the S1 inputs of multiplexers 905 and 917. The C2 output of configuration register 500 on a line 933 is applied through an inverter 934 to the S2 inputs of multiplexers 905 and 917. The selector or (S) input of multiplexer 926 is electrically connected to a line on which is applied the S7 selector signal of line 859 of FIG. 14b.

FIG. 15 is a logic diagram of the pipeline multiplexer 820 of FIG. 14a comprising the trigger pipeline section of a delay cell of the programmable pulse generator of the present invention. Multiplexer 820 provides a configurable pre-trigger latency in increments of the period of system clock CLK 903. Pre-trigger latency is desirable in complex at-speed test systems when a stream of precisely timed test stimuli must be scheduled and coordinated with other testing events.

Trigger input IN 821 is buffered by a buffer 929 and applied as the A input to pipeline bypass multiplexer 928. Thus, when configuration bit C0 is 0, multiplexer 928 selects and inverts the A input, and outputs the trigger by way of inverter 930 to output line 800.

Pipeline clear signal PCLR, externally derived from the system reset signal RST, is buffered and inverted to produce signal PCLR– on line 902. Trigger signals from buffer 929 are inverted to signal IN– on line 901, and applied to the input of flip-flop 900. Type D flip-flops 900, 907, 908, 910, 911, 912, and 913 are all placed in a quiescent state by the application of the pipeline clear signal PCLR– on line 902, and are all clocked in unison by the system clock signal CLK on line 903. The flip-flops form a seven-stage shift register with active-low outputs Q1–, Q2–, Q3–, Q4–, Q5–, Q6–, and Q7–, respectively. Thus, the application of an active-low trigger signal at input IN– on line 901 will be reflected at output Q1– after a next rising-edge of the system CLK on line 903, and reflected at the output Q2– on line 914 after the following rising edge of the system clock. The process continues from flip-flop to flip-flop and concludes at output Q7– on line 920. Four-input multiplexers 905 and 917, and two-input multiplexer 921 are ganged and controlled by configuration control bits C3 on line 922, C2 on line 933, and C1 on line 931 to effectively provide one eight-input multiplexer with the output MY–. Table II below illustrates the pipeline output selection as a function of the state of the configuration control bits C3 on line 922, C2 on line 933, and C1 on line 931. Polarity of configuration register bits is conventional. That is, a "logic 0" stored into the register yields a low logic level out of the register, and a "logic 1" stored in the register yields a high logic level.

TABLE II

| C3 922 | C2 933 | C1 931 | SELECTED INPUT | TRIGGER LATENCY CLOCKS |
|---|---|---|---|---|
| 0 | 0 | 0 | IN-(Line 901) | 0 |
| 0 | 0 | 1 | Q1-(Line 904) | 1 |
| 0 | 1 | 0 | Q2-(Line 914) | 2 |
| 0 | 1 | 1 | Q3-(Line 915) | 3 |
| 1 | 0 | 0 | Q4-(Line 916) | 4 |
| 1 | 0 | 1 | Q5-(Line 918) | 5 |
| 1 | 1 | 0 | Q6-(Line 919) | 6 |
| 1 | 1 | 1 | Q7-(Line 920) | 7 |

Inverters 932 and 934 invert and buffer configuration register bit outputs C1 on line 931 and C2 on line 933, respectively. The effects of applying inverted signals C1– and C2– to four-input multiplexers 905 and 917 are compensated by the corrective assignment of inputs IN– on line 901, Q1– on line 904, Q2– on line 914, and Q3– on line 915 to multiplexer inputs D, C, B, and A, respectively, and by the corrective assignment of inputs Q4– on line 916, Q5– on line 918, Q6– on line 919, and Q7– on line 920 to multiplexer inputs D, C, B, and A, respectively.

Multiplexer 921 output MY– is applied to the D input of flip-flop 923, adding an additional stage of trigger latency, and providing a synchronization in the event that the selected input is the asynchronous signal IN– on line 901. The Q output of flip-flop 923 is applied to the D input of flip-flop 925, thereby providing a further stage of trigger latency. Under control of the most-significant bit of the delay value, S7 on line 935, the 2-input multiplexer 926 selects the output of flip-flop 925 when S7 on line 935 is high. Trigger latency flip-flops 923 and 925 handle active-low signals, and thus are placed in their quiescent state when signal DCLR– on line 924, which is connected to both PRN inputs of flip-flops 923 and 925, is asserted. Signal DCLR– on line 924 is externally derived from either the LCLEAR (leading edge clear) or the TCLEAR (trailing edge clear) signal, both of which originate in the pulse generator asynchronous state machine 503 of FIG. 7a. Hence, when the programmable delay chain is operated in the pulse generator mode, trigger latency flip-flops 923 and 925 are both immediately reset at the completion of a programmed asynchronous delay.

Figure 16:
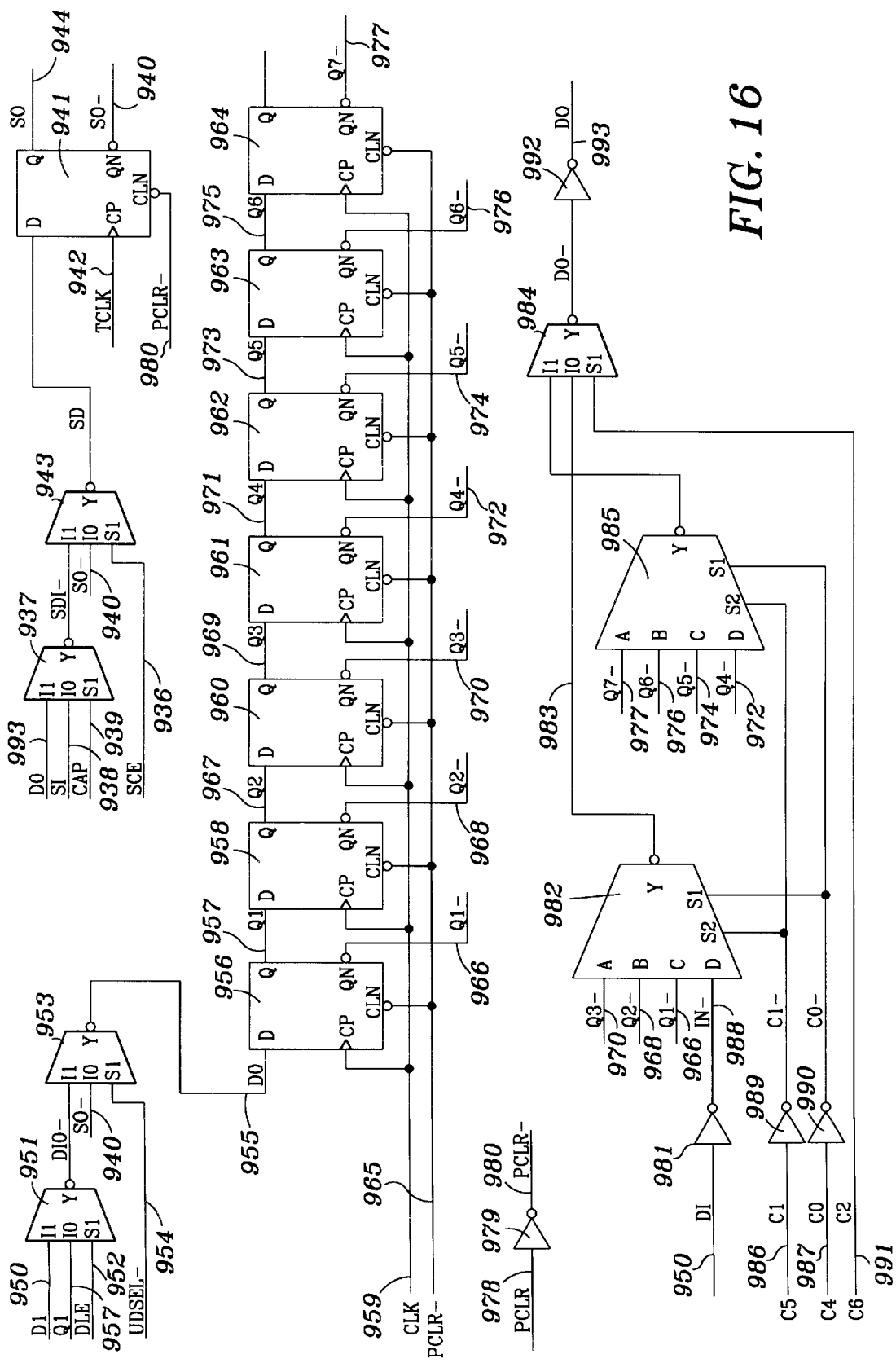
FIG. 16 is a logic circuit diagram of a representative one of pipeline multiplexers 840–847 of FIG. 14b.

Referring to FIG. 16, a representative one of multiplexers 840–847 is illustrated in more detail. A delay bit D0 is received from the system processor on a line 993 and applied to the I1 input of a multiplexer 937. A second input I0 of the multiplexer 937 receives a serial data input SI on line 938, and a third input S1 of the multiplexer 937 is electrically connected to line 939 on which is received a capture (CAP) signal from the JTAG interface I1 of FIG. 1. The inverter output of multiplexer 937 of FIG. 6 is applied to the I1 input of a multiplexer 943, the I0 input of which receives the serial data output signal S0– on a line 940. The S1 input of multiplexer 943 is electrically connected to a line 936 on which is received the signal SCE from the JTAG interface 11 of FIG. 1.

The inverted output of multiplexer 943 is supplied to the D input of a flip-flop 941, the CP input of which receives the JTAG clock signal TCLK by way of line 942. The Q output of flip-flop 944 (SO) is applied to line 944 which the complement signal at the QN output of the flip-flop is applied to line 940. The inverted clear or CLN– input of flip-flop 941 receives the PCLR– signal by way of a line 980.

A serial data stream DI is applied by way of a line 950 to one input of a multiplexer 951, a second input of which receives a delay latch enable signal from the system processor on a line 952. The inverted output of multiplexer 951 is applied to one input of a multiplexer 953, a second input of which receives an update data enable signal UDSEL– by way of a line 954. The output of multiplexer 953 is applied to a line 955 leading to the D input of a flip-flop 956. The Q output of flip-flop 956 issues a Q1 signal to a line 957 that is electrically connected to the D input of a flip-flop 958. The CP input to the flip-flop 956 is electrically connected to a line 959 on which the system clock CLK is received. Line 959 also is electrically connected to the CP inputs of flip-flop 958, flip-flop 960, flip-flop 961, flip-flop 962, flip-flop 963, and flop-flop 964. The inverted clear CLN inputs to flip-flops 956, 958, and 960–964 are electrically connected to a line on which the clear signal PCLR– is received.

The inverted QN output of flip-flop 956 applies a Q1– signal to a line 966, and the Q output of flip-flop 958 applies a Q2 signal by way of a line 967 to the D input of flip-flop 960, and the inverted QN output of flip-flop 967 applies a Q2– signal to a line 968. The Q output of flip-flop 960 issues a Q3 signal by way of a line 969 to the D input of flip-flop 961, and the inverted QN output of flip-flop 960 issues a Q3– signal to a line 970. The Q output of flip-flop 961 issues a Q4 signal by way of a line 971 to the D input of flop-flop 962, and the inverted QN output of flip-flop 961 applies a signal Q4– to a line 972. The Q output of flip-flop 962 applies a signal Q5 along a line 973 to the D input of a flip-flop 963, and the inverted QN output of the flip-flop issues a signal Q5– to a line 974. The Q output of flip-flop 963 applies a signal Q6 by way of a line 975 to the D input of flip-flop 964. The inserted QN output of flip-flop 963 issues a signal Q6– to a line 976. The inverted QN output of flip-flop 964 issues a signal Q7– to a line 977.

A pipeline clear PCLR signal is received on a line 978, and applied through an inverter 979 to line 980.

One bit of the eight bit delay value on line 950 also is applied through inverter 981 to the D input of a multiplexer 982, the C input of which is electrically connected to line 966. The B input of multiplexer 982 is electrically connected to line 968, and the A input of the multiplexer is electrically connected to line 970. The inverted output of multiplexer 982 is applied by way of a line 983 to one input of a multiplexer 984, a second input of which is electrically connected to the inverted output of a multiplexer 985. The A input to multiplexer 985 is electrically connected to line 977, and the B input to the multiplexer is electrically connected to line 976. The C input of multiplexer 985 is electrically connected to line 974, and the D input of the multiplexer is electrically connected to line 972.

The selection of an input of multiplexer 982 is controlled by a code of two bits, C1 and C0, respectively received from the configuration register 500 of FIG. 7a on lines 86 and 87, and applied through inverters 989 and 990 to the S2 and S1 inputs of multiplexers 982 and 985. The C2 bit output of the configuration register is applied by way of line 991 to the S1 input of multiplexer 984. The output of multiplexer 984 is applied through inverter 992 to yield the signal DO on line 993.

FIG. 16 is a logic diagram of a representative one of multiplexers 840–847 of the delay value pipeline section of a delay cell of the programmable pulse generator of the present invention. The multiplexer provides a configurable latency of the delay value reaching the asynchronous delay line in increments of the period of system clock CLK on line 959. Latency of the delay value can be desirable in complex at-speed test systems when a stream of precisely-timed test stimuli must be scheduled and coordinated with other testing events. Thus, the loading of a pulse latency and trigger latency may be adjusted to match latencies of other signals driven to a memory module unit under test or UUT.

All flip-flops in the delay value pipeline are reset upon the external application of signal PCLR 978, inverted to PCLR– 980 by inverter 979. Signal PCLR– 980 is then applied to the active-low CLN input of each flip-flop. All flip-flops in the delay value pipeline are clocked by system clock CLK 959.

A portion of the delay value pipeline logic is dedicated to JTAG test functions, described as follows. JTAG shift register flip-flop 941 is cleared by the application of PCLR– 980 to the active-low CLN input of flip-flop 941 and is clocked by JTAG clock TCLK 942 applied to the CP input of said flip-flop. When the JTAG logic is in its quiescent state, control lines UDSEL– 954, CAP 939, and SCE 936 are all de-asserted, that is, UDSEL– 954 is high, CAP 939 is low, and SCE 936 is low. Signal DLE 952 in a low state and applied to the selector input of multiplexer 951 routs and inverts signal Q1 957 to the output of said multiplexer. Signal UDSEL– 954 in a high state and applied to the selector in put of multiplexer 953 routs and inverts the output of said multiplexer, thence to the input of the first stage flip-flop of the delay value pipeline. Therefore, the Q1 957 output of flip-flop 956 is effectively fed back unaltered to the input of same flip-flop, thereby maintaining the existing state during continuous clocking by CLK 959.

During a JTAG capture-DR operation, signal CAP 939 goes high for one cycle of clock TCLK 942, causing multiplexer 937 to rout output signal DO 993 to the I1 input of multiplexer 943. Signal SCE 936 also goes high, causing multiplexer 943 to route the output of multiplexer 937 to the D input of JTAG shift register flip-flop 941. Therefore, the selected output of the delay value pipeline register at DO 993, is routed to the D input of flip-flop 941, and is clocked into said flip-flop upon the rising edge of TCLK 942.

During a JTAG shift-DR operation, signal CAP 939 is low, causing multiplexer 937 to rout serial input signal SI 938 to the I1 input of multiplexer 943. Signal SCE 936 goes high, causing multiplexer 943 to rout input I1 to the D input of JTAG shift register flip-flop 941. Therefore, the data appearing on line SI 938 are routed to the D input of flip-flop 941, and are shifted into said flip-flop upon the rising edge of TCLK 942. The output of flip-flop 941 is presented on SO 944 to be available to the next JTAG shift register flip-flop in the chain.

During a JTAG update-DR operation, signal UDSEL– goes low for one clock cycle of system clock CLK 959, causing multiplexer 953 to route JTAG shift register flip-flop output SO– 940 to signal D0 955 and thence to the D input of the first stage of the delay value pipeline register, flip-flop 956, thereby loading the first stage of the delay value pipeline register with the contents of the JTAG shift register flip-flop 941.

When it is desired to enter data into the delay value pipeline register, data latch enable signal DLE 952 is asserted for one clock cycle of system clock CLK 959, causing multiplexer 951 to rout data input DI 950 to the input of multiplexer 953 and thence to D0 955 at the D input of flip-flop 956. The state of the D input to flip-flop 956 is clocked into said flip-flop upon the next rising edge of CLK 959.

Thereafter, each subsequent rising edge of CLK 959 transfers the state of flip-flop 956 (Q1 957) to flip-flop 958 (Q2 967), and so forth, until the value loaded into flip-flop 956 has propagated to the final stage of the delay value pipeline, flip-flop 964 (Q7– 977). The outputs of four-input multiplexers 982 and 985 feed two-input multiplexer 984, effectively forming one eight-input multiplexer under control of signals C0 987, C1 986, and C2 991. Inverters 932 and 934 invert and buffer signals C1 931 and C2 933, respectively. The effects of applying inverted signals C0– and C1– to four-input multiplexers 982 and 985 are compensated by the corrective assignment of inputs IN– 988, Q1– 966, Q2– 968, and Q3– 970 to multiplexer 982 inputs D, C, B, and A; respectively, and by the corrective assignment of inputs Q4 972, Q5– 974, Q6– 976, and Q7– 977 to multiplexer 985 inputs D, C, B, and A, respectively. Signals C0 987, C1 986, and C2 991 reflect the state of configuration register bits C4, C5, and C6, respectively, and cause multiplexers 982, 985, and 984 to select and route either the input to the delay value pipeline register IN– 988 or one of seven outputs of the delay value pipeline register Q1– 966, Q2– 968, Q3– 970, Q4– 972, Q5– 974, Q6– 976, Q7– 977 to inverter 992 and thence to output DO 993.

Table III, below, shows the relationship between configuration register setting, selected input to multiplexers 982 and 985, and resultant delay value latency in cycles of system clock CLK 959.

TABLE III

| C2 991 | C1 986 | C0 987 | SELECTED INPUT | DELAY VALUE LATENCY (CLOCKS) |
|---|---|---|---|---|
| 0 | 0 | 0 | IN-988 | 0 |
| 0 | 0 | 1 | Q1-966 | 1 |
| 0 | 1 | 0 | Q2-968 | 2 |
| 0 | 1 | 1 | Q3-970 | 3 |
| 1 | 0 | 0 | Q4-972 | 4 |
| 1 | 0 | 1 | Q5-974 | 5 |
| 1 | 1 | 0 | Q6-976 | 6 |
| 1 | 1 | 1 | Q7-977 | 7 |

Figure 17C:
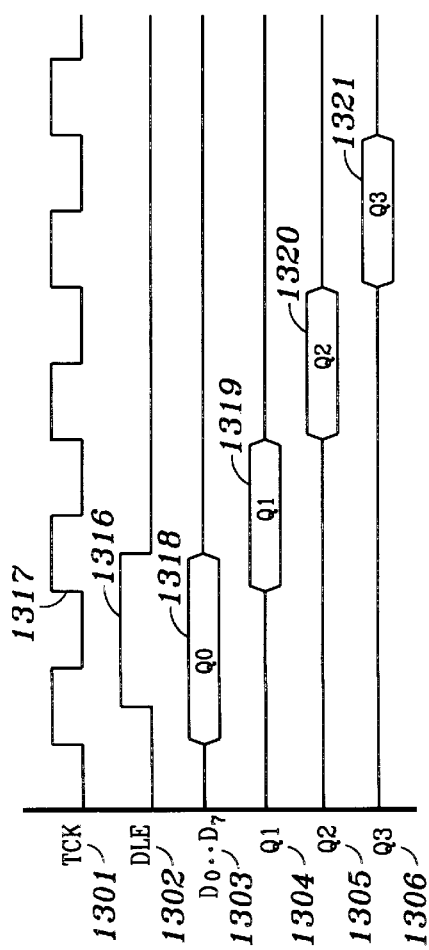
Figure 17D:
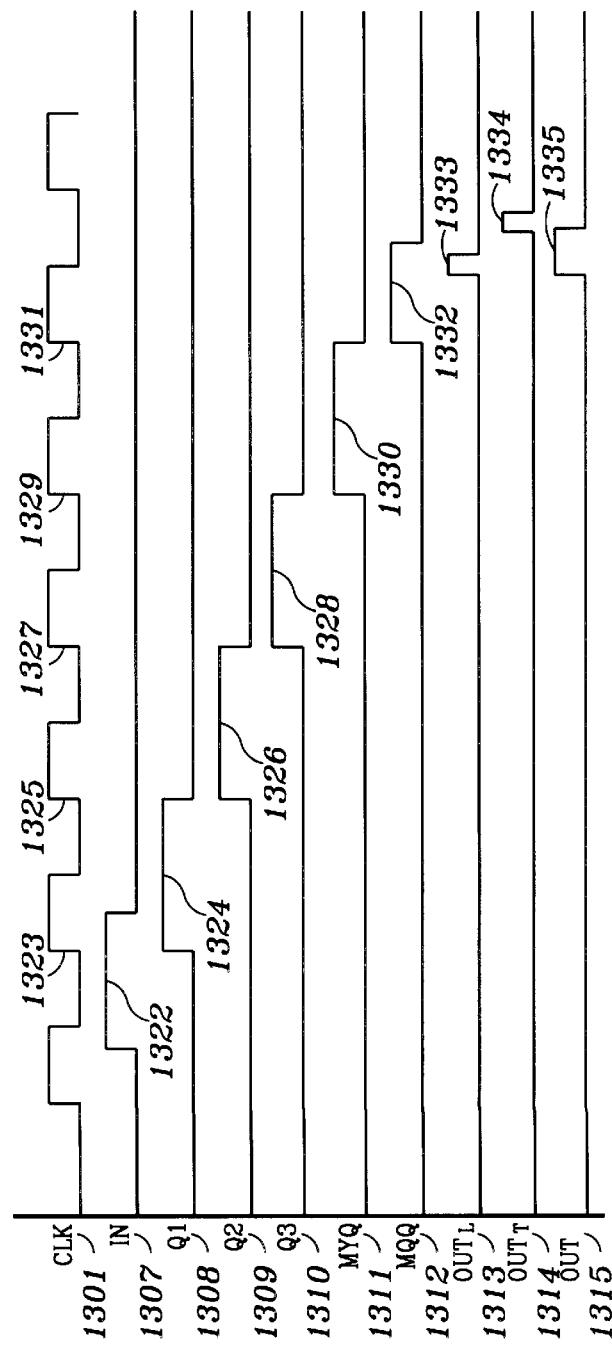

FIGS. 17a and 17b are timing diagrams depicting the operation of the JTAG interface 11 of FIG. 1, and FIGS. 17c and 17d are timing diagrams of the operation of programmable pulse generators 12e, 12b, 12c and 12d of FIG. 1. FIG. 17a shows timing signals involved during the configuration of the JTAG instruction register internal to the JTAG interface 11 of FIG. 1. FIG. 17b depicts timing signals during initialization of the configuration register 50 of FIG. 2. FIG. 17c illustrates timing signal controlling the loading of a latency value into the pipeline register 81 of FIG. 3, and the subsequent progression of the latency value through the register. FIG. 17d shows the application of the trigger input IN 901 of FIG. 15, and the subsequent progression through the trigger pipeline register of FIG. 15. The actuation of the synchronous delay unit 820 of FIG. 14a, the generation of a leading edge signal by leading delay 501 of FIG. 7 and the trailing edge signal by trailing delay cell 502 to form an output pulse.

Referring to FIGS. 1, 2 and 17a, in order to configure the ASIC 10 by writing to configuration register 50 of FIG. 2, it is first necessary to load JTAG instruction register internal to JTAG interface 11 of FIG. 1 with a binary code 00. This code indicates that subsequent JTAG data-shifting operations will be directed to the configuration register 50. When the signal RST of waveform 1201 is driven high at 1208, all registers and flip-flops within the ASIC 10 are forced into a known state. In particular, the JTAG state machine within the JTAG interface 11 is placed in test-logic-reset state F of waveform 1204 at 1210, the JTAG instruction register is set to binary value 10 at 1209 of waveform 1206, and data shift operations are placed in a JTAG 'bypass' mode.

In accordance with the operation of the JTAG state machine, all state changes may be effected by first setting the TMS control line as represented by waveform 1203 to a logic one or a logic zero, and then changing the TCK clock line as represented by waveform 1202 from a low to a high level.

With the TMS signal of waveform 1203 low as shown at 1211, and the TCK signal 1202 high as shown at 1212, the JTAG state machine proceeds from state "test-logic-reset" F at 1210 of waveform 1204 to state "run-test/idle" C at 1213 of waveform 1204. Next, the TMS signal of waveform 1203 is brought high at 1214 and the TCK signal of waveform 1202 is cycled high at 1215. The JTAG state machine thereby is caused to enter state "select-DR-scan" 7 of waveform 1204 at 1216. Thereafter, the TMS signal of waveform 1203 is held high as shown at 1217, and the TCK signal of waveform 1202 is cycled high at 1218. The JTAG state machine therefrom enters state "select-IR-scan" 4 of waveform 1204 at 1219.

Continuing, the TMS signal of waveform 1203 is held high as shown at 1220, and the TCK signal of waveform 1202 is cycled high at 1221. The JTAG state machine thus enters the state "capture-IR" E at 1222 of waveform 1204. The TMS signal of waveform 1203 then is brought low at 1223, and the TCK signal of waveform 1202 is brought high at 1224. The JTAG state machine thereupon enters state "shift-IR" A at 1225 of waveform 1204. The JTAG serial data stream SDI of waveform 1205 is held low at 1226, and the TCK signal of waveform 1202 is driven low at 1227 to shift the least-significant bit $I_0$ of an instruction into the JTAG serial instruction register at 1236 of waveform 1206. Here, $I_0$ is a "0". The TMS signal of waveform 1203 thereafter is held low as shown at 1228, and the TCK signal of waveform 1202 is brought high at 1229. The JTAG state machine remains in state "shift IR" A at 1230 of waveform 1204. Next, the JTAG serial data line SDI of waveform 1205 is held low as shown at 1231, and the TCK signal of waveform 1202 is driven low at 1232 to shift the most-significant bit $I_1$ of the instruction into the JTAG serial instruction register as shown at 1237 of waveform 1206. $I_1$ is a "0".

The TMS signal of waveform 1203 then is brought high at 1233 and the TCK signal of waveform 1202 is cycled high at 1234. The JTAG state machine thereupon enters state "exit1-IR" 9 at 1235 of waveform 1204. Next, the TMS signal of waveform 1203 is maintained high at 1238, and the TCK signal of waveform 1202 is brought high at 1239. The JTAG state machine in response thereto enters state "update-IR" D at 1240 of waveform 1204. The TCK signal of waveform 1202 then is brought low at 1241, thereby causing the contents of the 2-bit JTAG serial instruction register internal to the JTAG interface 11 of FIG. 1 to be loaded into the JTAG instruction register at 1242 of waveform 1206. The TMS signal of waveform 1203 then is brought low at 1243 and the TCK signal of waveform 1202 is cycled high at 1244 to cause the JTAG state machine to enter state "run-test/idle" C at 1245 of waveform 1204. The state machine remains there for any subsequent cycles of the TCK signal of waveform 1202, provided that the TMS signal of waveform 1203 is held low. The preceding process requires 9 cycles of the TCK signal of waveform 1202 to elapse, beginning with the de-assertion of the RST signal of waveform 1201 at 1208, and ending with state "run-test/idle" C at 1245 of waveform 1204. Thus approximately 10 μs are required when the TCK signal of waveform 1202 has a frequency of 1 MHz.

Referring to FIG. 17b, the operation of the ASIC 10 of FIG. 1 is depicted on initializing the programmable delay 8-bit configuration register 50 of FIG. 2. The configuration register is accessible only through the JTAG serial data facility. However, because of the serial interconnection of the 8-bit configuration register 50 with the 8-bit leading edge delay value register within leading delay cell 51, and the 8-bit trailing edge delay value register within trailing delay cell 52, of each of the four pulse generators 12a, 12b, 12c, and 12d of FIG. 1, the initialization of the configuration register 50 necessitates clocking 24×4 bits of data serially to configure the ASIC completely, as will be described in detail below.

Returning to FIG. 17b, the JTAG state machine is in state "run-test/idle" C at 1260 of waveform 1204, the TMS signal of waveform 1203 is brought high at 1261, and the TCK signal of waveform 1202 is cycled high at 1262. The JTAG state machine thereupon enters the state "select-DR-scan" 7 at 1263 of waveform 1204. Next, the TMS signal of waveform 1203 is brought low at 1264 and the TCK signal of waveform 1201 is cycled high at 1265. The JTAG state machine thereupon enters state "capture-DR" 6 at 1266 of waveform 1204. Concurrent with the latency of state "capture-DR" 6, the signal CAPD of waveform 1250 is asserted at 1271 to cause the contents of the 8-bit configuration register 50 of FIG. 2, the 8-bit leading delay cell 51, and the 8-bit trailing delay cell 52 to be loaded (on the falling edge of the TCK signal of waveform 1202 at 1272) into the 24-bit JTAG shift register. Thus, as new values are being shifted in, old values are simultaneously being shifted out of the configuration for JTAG testing, if desired. Concurrent with the latency of state "capture-DR" 6 at 1266 of waveform 1204, signal SCED of waveform 1251 is asserted at 1272 to change the shifting of serial data from SDI "in" to SDO "out" of the configuration register 50, and the delay cells 51 and 52 from a "hold" mode to a "shift" mode.

The TMS signal of waveform 1203 is held low at 1267 and the TCK signal of waveform 1202 is brought high at 1268 to cause the IEEE standard JTAG state machine to enter state "shift-DR" 2 at 1269 of waveform 1204. Next, bit D₀ of the trailing-edge delay value TDV₀ at 1270 of waveform 1205 is placed at the input of the serial JTAG data stream and, and the TCK signal of waveform 1202 is brought low at 1273 thereby causing the TDV₀ value to be clocked into the configuration register 50 of FIG. 2. Thereafter, the TMS signal of waveform 1203 is held low at 1274 and the TCK signal of waveform 1202 is brought high at 1275 to cause the IEEE standard JTAG state machine to remain in state "shift-DR" 2 at 1276 of waveform 1204. Next, bit D₁ of the trailing-edge delay value TDV₁ at 1277 of waveform 1205 occurs, and the TCK signal of waveform 1202 is brought low at 1278 thereby causing the delay value TDV₁ to be clocked into the configuration register 50 as previously described. Further cycles of the TCK signal of waveform 1202, while the TMS signal of waveform 1203 is held low, clock the remaining bits of the delay value into the configuration register, followed by the eight (8) bits of the leading-edge delay value, followed by eight (8) bits of configuration data. The configuration data is comprised of a latency on-bit, three trigger latency value bits, three latency value bits, and a pulse mode bit.

When the most-significant bit has been shifted into the configuration register at 1279 of waveform 1205, the IEEE standard JTAG state machine is in state "shift-DR" 2 at 1280 of waveform 1204, the TMS signal of waveform 1203 is brought high at 1281, and the TCK signal of waveform 1202 is cycled high at 1282. The IEEE standard JTAG state machine thereupon enters state "exit1-DR" 1 at 1283 of waveform 1204. Simultaneously, the SCED signal of waveform 1251 is brought low at 1284 to change the serial shift control from a "shift" mode back to a "hold" mode. Next, the TMS signal of waveform 1203 is held high at 1285, and the TCK signal of waveform 1202 is brought high at 1286 to cause the IEEE standard JTAG state machine to enter state "update-DR" 5 at 1287 of waveform 1204. Concurrent with state "update-DR" 5 at 1287, the loading of the 8 bit configuration register 50 of FIG. 2 is enabled, and the signal UCED of waveform 1252 is asserted at 1288 and sent as an input to the JTAG state machine 300 as previously described. The state machine 300 output UDSEL of waveform 1253 then initiates a parallel transfer at 1289 from the 16-bit JTAG shift register into the 8-bit leading delay cell 51, and the 8-bit trailing delay cell 52.

Thereafter, the TMS signal of waveform 1203 is brought low at 1290, and the TCK signal of waveform 1202 is cycled high at 1291 to cause the IEEE standard JTAG state machine to enter state "run-test/idle" C at 1292 of waveform 1204, and remain there for any subsequent cycles of the TCK signal of waveform 1202, provided that the TMS signal of waveform 1203 is held low. Typically, the TMS signal is then set high, and three JTAG clock (TCK) cycles later, the JTAG state machine of FIGS. 4, 5, and 6 is returned io the quiescent state.

Referring to FIG. 17c a CLK signal of waveform 1301 represents the main system clock. The DLE signal of waveform 1302 is a data latch (enable signal, which, when asserted at 1316, allows the delay value present at 1318 of waveform 1303 and on bus $D_0 \ldots D_7$ to be clocked out of flip-flop 956 of FIG. 16 at 1319 of waveform 1309 upon the next rising edge of the CLK signal of waveform 1302 at 1317. Thereafter, on the rising edge of subsequent cycles of the CLK signal of waveform 1301 of FIG. 17c, data first loaded into the pipeline register of FIG. 16 propagates to next stages as depicted by waveform 1305 at 1320, and waveform 1306 at 1321. Assuming that a binary value of 0-1-1 was loaded into bits $C_6$-$C_5$-$C_4$, respectively, of configuration register 50 of FIG. 2, multiplexers for each of the eight (8) bits of the delay value (multiplexers 840–847 of FIG. 14b) select their respective Q3 inputs for output to the asynchronous delay unit of FIG. 14a.

Referring to FIG. 17d, the CLK signal of waveform 1301 represents the main system clock. The signal IN of waveform 1307 is the trigger to the pulse generator 500 of FIG. 7a which appears as the signal TIN on line 528 and the LIN signal on line 519. The signal IN of waveform 1307 is asserted at 1322 and sampled at the rising edge of the CLK signal of waveform 1301 at 1323. The trigger pipeline register output Q1 of waveform 1308 thereby is set at 1322. Upon the next rising edge of the CLK signal of waveform 1301 at 1325, the trigger pipeline register output Q2 of waveform 1309 is set at 1326. In a similar manner, upon the next rising edge of the CLK signal of waveform 1301 at 1327, the trigger pipeline register output Q3 of waveform 1310 is set at 1328.

Referring to FIG. 15, assuming that a binary value of 0-1-1 was loaded into bits $C_3$-$C_2$-$C_1$ respectively at lines 922, 933 and 931 of multiplexers 905 and 921 deliver the inverse of the Q3 pulse at 1328 of waveform 1310 of FIG. 17d to the input of multiplexer 923 of FIG. 15. Upon the next rising edge of the CLK signal of waveform 1301 of FIG. 17d at 1329, the MYQ signal of waveform 1311 is output by flip-flop 923 of FIG. 15. Upon selection by multiplexer 926 when the S7 trigger on line 935 is high, a further delay is introduced as shown by the MQQ of waveform 1312 at 1332 after the next rising edge of the CLK signal of waveform 1301 at 1331. It should be noted that the trailing edge of MQQ of waveform 1312 at pulse 1332 will occur as a result of the next rising edge of CLK of waveform 1301 or the issuance of signal DCLR– on line 924 of FIG. 15. With a 1 in bit $C_0$ of the configuration register 50 of FIG. 2, multiplexer 928 of FIG. 15 outputs the active-low pipelined trigger signal to inverter 930 to yield an active-high output on output line 800.

Because a common configuration register controls a pair of identical leading- and trailing-edge delay sections, the above waveforms and accompanying descriptions apply similarly to both delay sections. Assuming coincident leading- and trailing-edge triggers IN of waveform 1307 of FIG. 17d, the signal OUT on line 800 of FIG. 15 for the leading edge pipeline section, and the corresponding OUT signal on line 800 for the trailing edge pipeline section, will also be coincident. However, if a longer trailing edge delay value than a leading edge delay value has been programmed, the signal $OUT_L$ at 1333 of waveform 1313 of FIG. 17d will precede the signal $OUT_T$ at 1334 of waveform 1315. The resultant pulse OUT at 1335 of waveform 1315 therefore has a width equal to the difference in time between the arrival of the rising edge of the signal $OUT_L$ at 1333 of waveform 1313 and the arrival of the rising edge of the signal $OUT_T$ at 1334 of waveform 1315.

The invention has been described and shown with reference to particular embodiments, but variations within the spirit and scope of the general inventive concept will be apparent to those skilled in the art. Accordingly, it should be clearly understood that the form of the invention as described and depicted in the specification and drawings is illustrative only, and is not intended to limit the scope of the invention. All changes which come within the meaning and range of the equivalence of the claims are therefore intended to be embraced therein.

What is claimed is:

1. A programmable pulse generator for generating a pulse signal to gate control, address, and data signals of a memory test system having a microprocessor, which comprises:

a configuration register in electrical communication with said microprocessor and having stored therein a trigger latency code and a pulse latency code, and a mode bit received from said microprocessor;

a leading delay cell in electrical communication with said configuration register and said microprocessor, and receiving said trigger latency code and said pulse latency code from said configuration register, and a trigger signal and a latency value from said microprocessor for generating a leading edge signal for said pulse signal;

trailing delay cell in electrical communication with said configuration register, said microprocessor, and said leading delay cell, and receiving said trigger latency code and said pulse latency code from said configuration register, and said trigger signal and said latency value from said microprocessor for generating a trailing edge signal for said pulse signal; and a pulse controller in electrical communication with said configuration register, said leading delay cell, and said trailing delay cell, and receiving said mode bit signal from said configuration register to select between combining said leading edge signal and said trailing edge signal to form said pulse signal, and issuing said leading edge signal and said trailing edge signal independently.

2. The programmable pulse generator of claim 1, wherein said leading delay cell and said trailing delay cell each have a pulse latency delay pipeline and a trigger delay pipeline, and said pulse latency delay pipeline and said trigger delay pipeline respectively are programmable in latency in response to said pulse latency code and said trigger latency code, and said pulse latency delay pipeline further is programmable in latency in response to said latency value.

3. The programmable pulse generator of claim 2, wherein said leading delay cell and said trailing delay cell each have a programmable delay chain in electrical communication with said pulse latency delay pipeline and said trigger delay pipeline, for receiving said latency value from said pulse latency delay pipeline upon receipt of said trigger signal from said trigger delay pipeline, and for imparting a programmable delay to said latency value in the range of 0 to 63.5 nanoseconds and with a typical resolution of 0.5 nanoseconds.

4. The programmable pulse generator of claim 3, wherein said programmable pulse generator includes a system clock generator, and a JTAG interface in electrical communication with said microprocessor and said configuration register, and said pulse latency delay pipeline includes a facility for receiving a delay value from said JTAG interface which is synchronized with a JTAG clock signal issued by said JTAG interface, and for loading said delay value into a first stage of said pulse latency delay pipeline which is synchronized with a system clock signal issued by said system clock generator.

5. The programmable pulse generator of claim 1, wherein said pulse controller is comprised of a state machine in electrical communication with said configuration register, said leading delay cell, said trailing delay cell, and said microprocessor, and receiving said leading edge signal and said trailing edge signal for forming said pulse signal, and generating a leading delay cell reset signal and a trailing delay cell reset signal for clearing said leading delay cell and said trailing delay cell to await receipt of a new pulse latency code and a new trigger latency code from said configuration register, and a new trigger signal and a new latency value from said microprocessor.

6. The programmable pulse generator of claim 5, wherein said pulse controller is further comprised of a multiplexer means in electrical communication with said configuration register, said trailing edge cell, and said leading edge cell, and receiving said pulse signal from said state machine, and said leading edge signal and said trailing edge signal respectively from said leading edge cell and said trailing edge cell, and responsive to said mode bit signal for selecting among said pulse signal, said leading edge signal, and said trailing, edge signal for output to said memory test system.

7. The programmable pulse generator of claim 5, wherein said state machine recognizes an arrival of said trailing edge signal before said leading edge signal, and in response thereto suppresses generation of a spurious output pulse, and returns to a quiescent state.

8. A method of controlling latency in generating a pulse signal to a memory system having a microprocessor; comprising the steps of:

generating a first trigger signal;

selecting between a pulse generation mode, and a leading trigger edge and a trailing trigger edge flow-through mode;

selecting a trigger latency code to control latency of said first trigger signal;

generating a second trigger signal having a latency in accordance with said trigger latency code;

selecting a pulse latency code to control latency of a first latency value received from said microprocessor;

generating a second latency value having a latency in accordance with said pulse latency code;

in response to said second trigger signal, generating a leading edge signal and a trailing edge signal which are delayed in accordance with said second latency value;

if said pulse generation mode has been selected, generating a pulse which is defined by said leading edge signal and said trailing edge signal; and if said leading trigger edge and said trailing trigger edge flow-through mode has been selected, passing said leading edge signal and said trailing edge signal to said memory test system.

* * * * *